United States Patent
Inada et al.

(10) Patent No.: US 9,214,649 B2
(45) Date of Patent: Dec. 15, 2015

(54) LIGHT-EMITTING DEVICE

(71) Applicant: Panasonic Intellectual Property Management Co., Ltd., Osaka (JP)

(72) Inventors: Yasuhisa Inada, Osaka (JP); Taku Hirasawa, Kyoto (JP); Manabu Nakata, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/570,015

(22) Filed: Dec. 15, 2014

(65) Prior Publication Data
US 2015/0179977 A1    Jun. 25, 2015

(30) Foreign Application Priority Data

Dec. 25, 2013 (JP) ................. 2013-267350
Dec. 25, 2013 (JP) ................. 2013-267351
Sep. 18, 2014 (JP) ................. 2014-190216

(51) Int. Cl.
*H01L 51/50* (2006.01)
*H01L 51/52* (2006.01)

(52) U.S. Cl.
CPC ........ *H01L 51/5262* (2013.01); *H01L 51/5203* (2013.01)

(58) Field of Classification Search
CPC ..... H01L 27/32; H01L 27/3209; H01L 51/50; H01L 51/5262
See application file for complete search history.

(56) References Cited

U.S. PATENT DOCUMENTS

| | | |
|---|---|---|
| 2007/0290608 A1 | 12/2007 | Choi et al. |
| 2010/0087019 A1 | 4/2010 | Choi et al. |
| 2012/0018705 A1 | 1/2012 | Takazoe et al. |
| 2012/0286258 A1 | 11/2012 | Naraoka et al. |
| 2013/0186467 A1* | 7/2013 | Saeki ............ B29C 33/424 136/259 |
| 2014/0008628 A1 | 1/2014 | Yamana et al. |
| 2014/0027753 A1 | 1/2014 | Yamana et al. |

FOREIGN PATENT DOCUMENTS

| | | |
|---|---|---|
| JP | 2006-236748 | 9/2006 |
| JP | 2007-234254 | 9/2007 |
| JP | 2009-009861 | 1/2009 |
| JP | 2012-204019 | 10/2012 |
| JP | 2013-175403 | 9/2013 |
| WO | 2010/010634 | 1/2010 |
| WO | 2011/132773 | 10/2011 |
| WO | 2013/001891 | 1/2013 |

* cited by examiner

*Primary Examiner* — Jae Lee
(74) *Attorney, Agent, or Firm* — Renner, Otto, Boisselle & Sklar, LLP

(57) ABSTRACT

A light-emitting device includes: a light-emitting element including a transparent electrode, a reflecting electrode, and an organic layer that includes a light-emitting layer; a transparent multilayer body including a low-refractive-index layer and a high-refractive-index layer, the high-refractive-index layer being provided in contact with the transparent electrode; a first uneven structure at an interface between the low-refractive-index layer and the high-refractive-index layer, the first uneven structure including depressions and projections, a height of each of the projections relative to the depressions being 400 nm or more; and a second uneven structure at an interface between the reflecting electrode and the organic layer, the second uneven structure including depressions and projections, a height of each of the projections relative to the depressions in the second uneven structure being 20 nm or more and 100 nm or less.

12 Claims, 27 Drawing Sheets

FIG. 30A 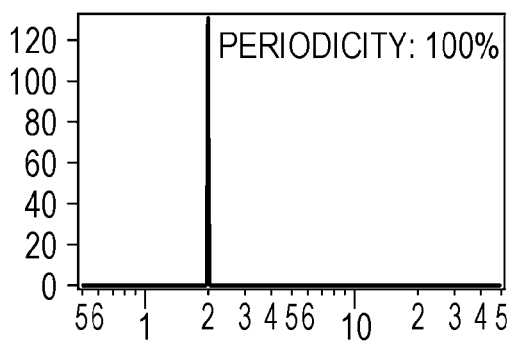 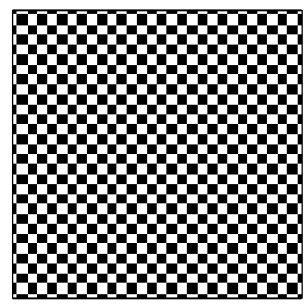
FIG. 30B 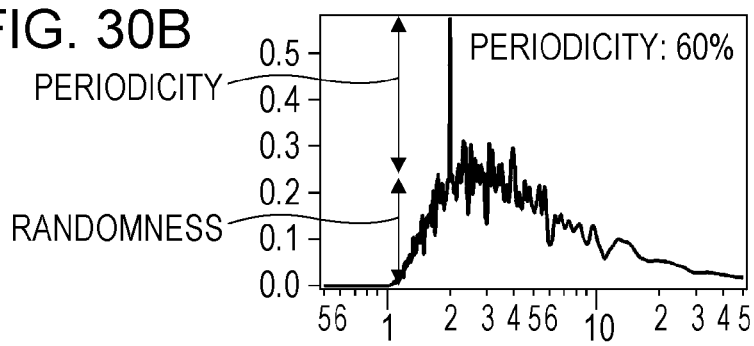 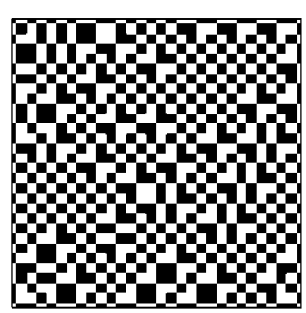
FIG. 30C 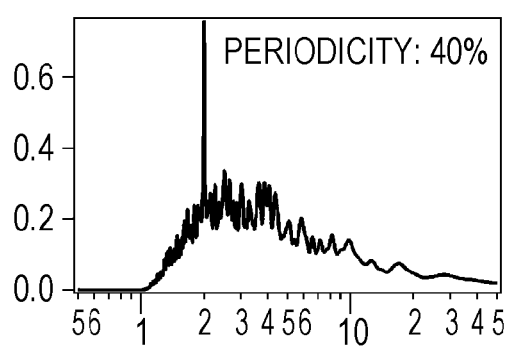 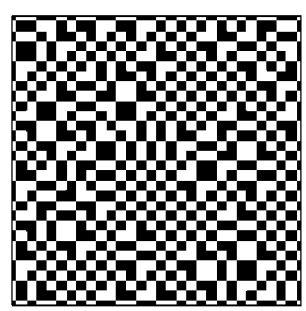
FIG. 30D 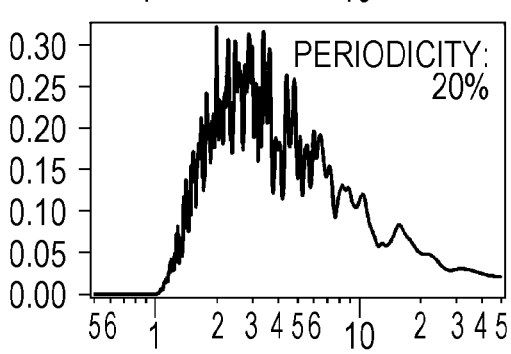 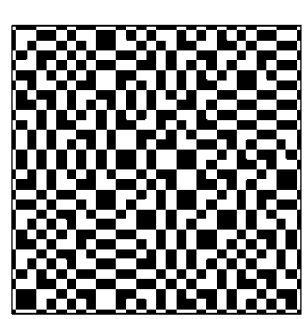
FIG. 30E 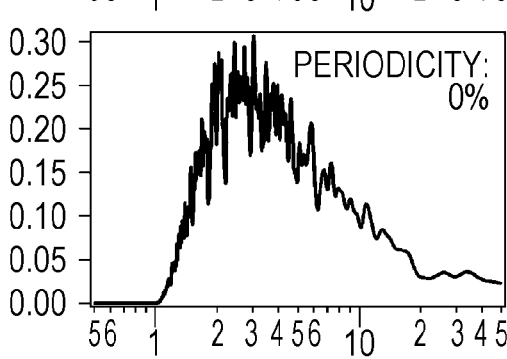 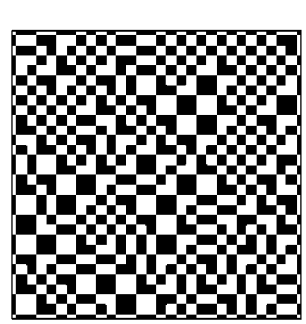

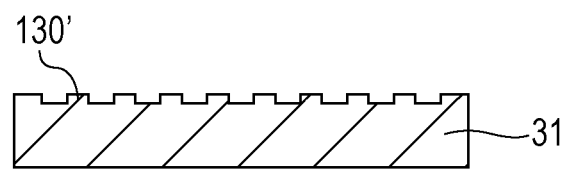
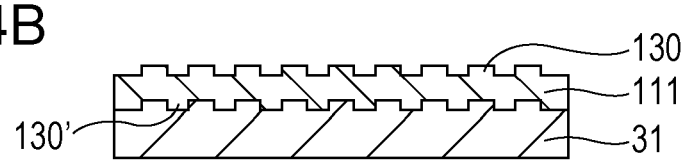
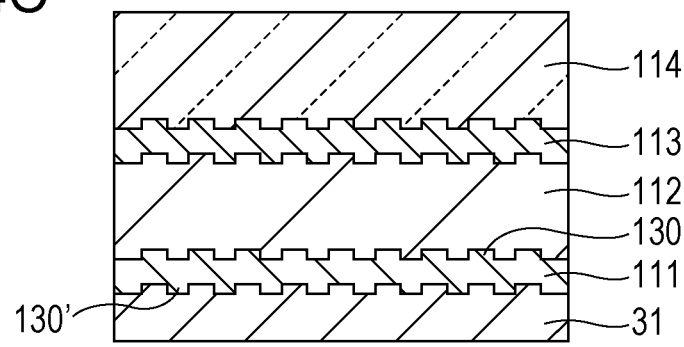

LIGHT-EMITTING DEVICE

This application claims priority to Japanese Patent Applications No. 2013-267350, filed on Dec. 25, 2013, and No. 2013-267351, filed on Dec. 25, 2013, the contents of each of which are hereby incorporated by reference.

BACKGROUND

1. Technical Field

The present disclosure relates to a light-emitting device such as an organic electroluminescence element (hereafter referred to as "an organic EL element").

2. Description of the Related Art

Organic EL elements have been examined for application to various light-emitting devices and have been practically used as light-emitting devices. For example, organic EL elements are used for flat panel displays, backlight units for liquid crystal displays, and light sources for illumination.

SUMMARY

The present disclosure provides a light-emitting device in which generated light can be extracted with a high efficiency.

A light-emitting device according to an aspect of the present disclosure includes: a light-emitting element including a transparent electrode, a reflecting electrode, and an organic layer that includes a light-emitting layer and is sandwiched between the transparent electrode and the reflecting electrode; a transparent multilayer body including a low-refractive-index layer and a high-refractive-index layer, the high-refractive-index layer having higher refractive index than that of the low-refractive-index layer and being provided in contact with the transparent electrode; a first uneven structure at an interface between the low-refractive-index layer and the high-refractive-index layer, the first uneven structure including depressions and projections, a height of each of the projections relative to the depressions being 400 nm or more; and a second uneven structure at an interface between the reflecting electrode and the organic layer, the second uneven structure including depressions and projections, a height of each of the projections relative to the depressions in the second uneven structure being 20 nm or more and 100 nm or less.

A light-emitting device according to another aspect of the present disclosure includes a transparent electrode, a reflecting electrode, and an organic layer that includes a light-emitting layer and is sandwiched between the transparent electrode and the reflecting electrode. An uneven structure is formed at an interface between the reflecting electrode and the organic layer. The uneven structure has an uneven shape in which at least two types of unit structures are two-dimensionally arranged in a random pattern. Each type of the unit structures has a pattern formed by one or more depressions and one or more projections.

It should be noted that general or specific embodiments may be implemented as a device, a system, a method, or any elective combination thereof.

According to the light-emitting device of the present disclosure, generated light can be extracted to the outside with a high efficiency.

Additional benefits and advantages of the disclosed embodiments will be apparent from the specification and Figures. The benefits and/or advantages may be individually provided by the various embodiments and features of the specification and Figures, and need not all be provided in order to obtain one or more of the same.

BRIEF DESCRIPTION OF THE DRAWINGS

FIGS. 30A to 30E show five uneven patterns having different proportions of periodical components and the results obtained by Fourier transforming the patterns.

FIGS. 34A to 34C illustrate another example of a method for producing a light-emitting device including an uneven structure.

DETAILED DESCRIPTION OF THE EMBODIMENTS

The present inventors have thoroughly studied the extraction of light generated in a light-emitting layer of an organic EL element to the outside with a high efficiency, that is, a structure that increases the light extraction efficiency.

Figure 1:
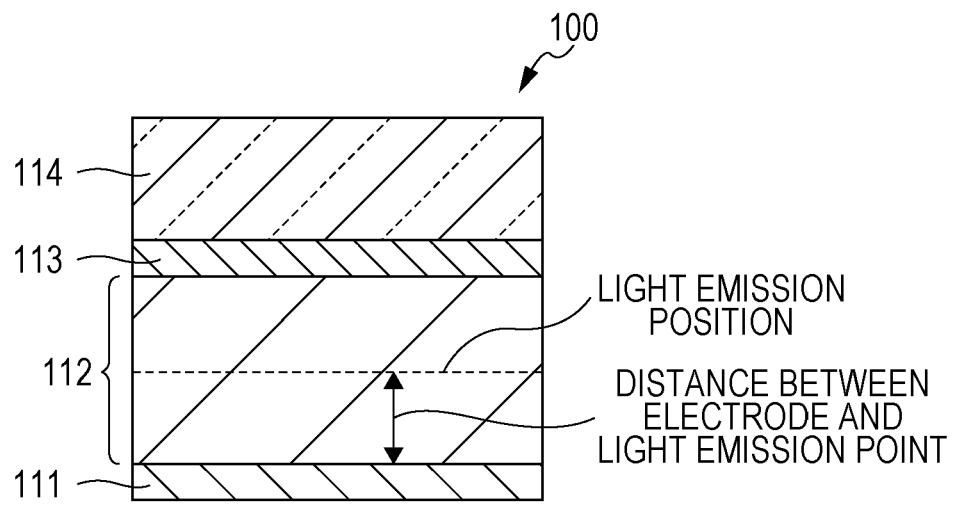
FIG. 1 is a sectional view illustrating a structure of an organic EL element not according to an embodiment of the present disclosure.

FIG. 1 is a sectional view schematically illustrating a structure of an organic EL element not according to an embodiment of the present disclosure. As illustrated in FIG. 1, a typical organic EL element 100 includes a reflecting electrode 111, an organic layer 112, a transparent electrode 113, and a transparent substrate 114 stacked in that order. The organic layer 112 includes an electron injection layer, an electron transport layer, a light-emitting layer, a hole transport layer, and a hole injection layer stacked on top of one another (not illustrated). Typically, the electron injection layer and the electron transport layer are located on the cathode side, the hole injection layer and the hole transport layer are located on the anode side, and the light-emitting layer is located between the electron transport layer and the hole transport layer. Hereafter, the case where the reflecting electrode 111 is a cathode and the transparent electrode 113 is an anode will be considered. It is assumed that the electron transport layer and the hole transport layer are located so as to be in contact with the cathode and the anode, respectively. The case where the transparent electrode 113 is a cathode and the reflecting electrode 111 is an anode can also be considered in the same manner.

The efficiency of organic EL elements is mainly affected by three factors such as electrical-to-optical conversion efficiency, drive voltage, and light extraction efficiency. Regarding the electrical-to-optical conversion efficiency, an organic EL element having an external quantum efficiency of more than 20% due to the recent advent of a phosphorescent material has been reported. Such an external quantum efficiency of more than 20% is considered to correspond to an internal quantum efficiency of about 100%. This means that an example in which the electrical-to-optical conversion efficiency substantially reaches its limit has been experimentally confirmed.

Regarding the drive voltage, an element that emits light with relatively high luminance at a voltage about 10% to 20% higher than a voltage corresponding to energy gap has been produced. In other words, there is little room for improvement in the efficiency of organic EL elements by a decrease in drive voltage. Therefore, it is not so promising to improve the efficiency of organic EL elements by the improvement of two factors such as electrical-to-optical conversion efficiency and drive voltage.

The light extraction efficiency of organic EL elements is generally about 20% to 30%, though depending on the light-emitting pattern and the internal layer structure to some extent, which provides a plenty of room for improvement. The light extraction efficiency is low as described above. It is because materials forming a portion in which light is generated and forming periphery of the portion have properties such as a high refractive index and a light-absorbing property. Therefore, the total reflection at an interface between the material and another material having different refractive indices and the light absorption at the materials are caused, which makes it difficult for light to effectively propagate to the outside where light emission is to be observed.

In organic EL elements, the distance between the light emission position and the reflecting electrode is often decreased (e.g., 30 to 80 nm) to increase the intensity of light emitted in the front direction (the upper direction in FIG. 1) by interference of light. However, a short distance between the light emission position and the reflecting electrode exerts the influence of a surface plasmon. The term "surface plasmon" is a mode of vibration in which electrons present on a metal surface undergo collective vibration. A phenomenon in which free electrons in a metal and light interact with each other is referred to as "surface plasmon resonance". In organic EL elements, the reflecting electrode is mainly made of a metal such as aluminum (Al) or silver (Ag) in many cases. When the distance between the light emission position and the reflecting electrode is short, part of light generated at the light emission position is coupled with the surface plasmon and then absorbed in the reflecting electrode.

U.S. Pat. No. 7,667,387 (Patent Document 1) and U.S. Patent Application Publication No. 2010/0087019 (Patent Document 2) describe that, as a result of the surface plasmon resonance, unusable light accounts for 70% to 80% of the total amount of emitted light in organic EL elements. Therefore, it is considerably promising to improve the efficiency of organic EL elements by an improvement in the light extraction efficiency.

Patent Document 1 and Patent Document 2 disclose an organic EL element for reducing the total reflection loss while reducing the loss of light caused by a surface plasmon at an interface between a light-emitting layer and an electrode. In the organic EL element, protrusions are periodically located in a portion of a light-emitting layer that is in contact with an electrode. Patent Document 1 and Patent Document 2 describe that the emission efficiency can be improved by converting the surface plasmon into light and extracting the light toward the light-emitting layer.

International Publication No. 2010/010634 (Patent Document 3) discloses an organic EL element including a reflecting electrode. In the organic EL element, depressions and projections are formed at an interface between an organic layer and a reflecting electrode for the purpose of improving the reflection efficiency at the interface between the reflecting electrode and the organic layer. The depressions and projections are formed by forming a periodical uneven shape on a transparent substrate using a curable transparent resin and forming an organic layer and a reflecting electrode thereon.

However, as a result of studies conducted by the present inventors on the structure and production method disclosed in Patent Document 1 and Patent Document 2, locally thick portions are formed in the light-emitting layer due to the protrusions in the structure disclosed in Patent Document 1 and Patent Document 2. Therefore, the carrier transport (or injection) property degrades in the thick portions of the light-emitting layer, which may degrade the electrical properties.

In the structure disclosed in Patent Document 3, the uneven shape is reflected on the entire organic layer. If the height of the uneven shape is, for example, more than 100 nm, an organic layer having a multilayer structure with a height of some tens of nanometers is divided. Consequently, an electric current does not flow in the entire organic layer or electrical continuity is made between electrodes. Thus, such an organic EL element sometimes does not properly work.

In view of the foregoing, the present inventors have thoroughly studied a structure for reducing the loss of light caused by a surface plasmon and a structure for reducing the total reflection loss.

Structure for Suppressing Plasmon

First, the present inventors studied the influence exerted when light emitted from the light-emitting layer of an organic EL element is coupled with the plasmon. Assuming that the organic layer has a refractive index of 1.8, the reflecting electrode is made of Ag or Al, and the emission wavelength is 500 nm, the calculation was conducted by a transfer matrix method. The same calculation can also be conducted with software such as "setfos" available from CYBERNET SYSTEMS Co., Ltd., instead of the transfer matrix method. In the structure illustrated in FIG. 1, the relationship between the distance from the interface between the reflecting electrode 111 and the organic layer 112 to the light emission point and the proportion of the amount (emission amount) of light extracted to the transparent substrate 114 without being coupled with the surface plasmon was calculated.

Figure 2:
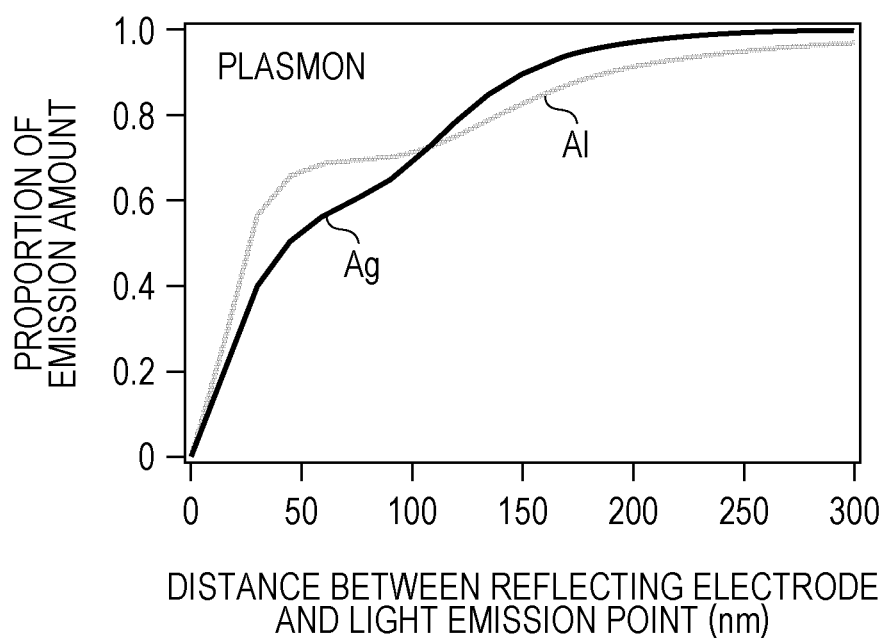
FIG. 2 shows the calculation results about the relationship between the distance from an interface between a reflecting electrode and an organic layer to a light emission point and the proportion at which the energy at the light emission point is converted into light without being consumed as a surface plasmon.

FIG. 2 shows the calculation results. In FIG. 2, the vertical axis shows the proportion of propagating light generated as a result of emission. The difference between 1 and the proportion indicates the loss of light caused by a surface plasmon effect. As is clear from FIG. 2, the proportion of the emission amount decreases as the distance between the light emission point and the reflecting electrode 111 decreases. This is because the generated light is more easily coupled with the surface plasmon on a metal surface as the light emission point becomes closer to the reflecting electrode.

Figure 3:
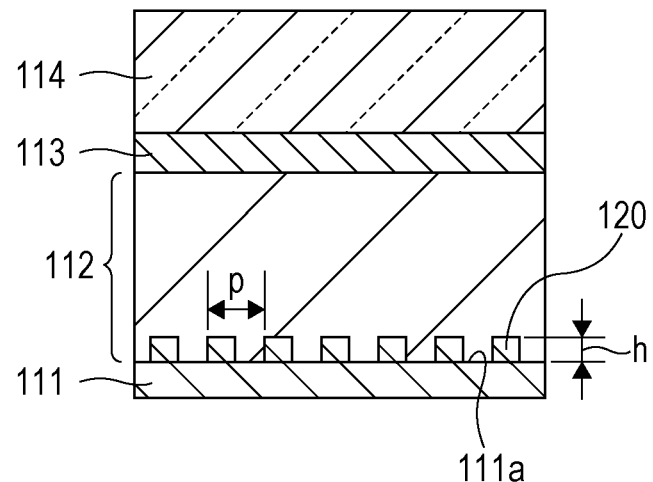
FIG. 3 is a sectional view of an organic EL element including a periodical uneven structure at an interface between a reflecting electrode and an organic layer.

As described above, the surface plasmon is a mode of vibration in which electrons present on a metal surface undergo collective vibration. Therefore, it is considered that, by disposing, on a metal surface, a structure in which electrons do not easily undergo collective vibration, the plasmon effect is suppressed and thus the interaction with light can be suppressed. For example, a periodical uneven structure 120 is located at an interface 111a between the reflecting electrode 111 and the organic layer 112 in the organic EL element as illustrated in FIG. 3. In this case, it is considered that the surface plasmon is suppressed and thus the proportion of the emission amount increases. Important parameters of the uneven structure are a pitch p of the uneven structure and a height h of the uneven structure (i.e. difference in level between the bottom surface of a depression and the upper surface of a projection). Thus, the present inventors have thoroughly studied the pitch of the uneven structure located on the reflecting electrode 111 and the height of the uneven structure.

Figure 4:
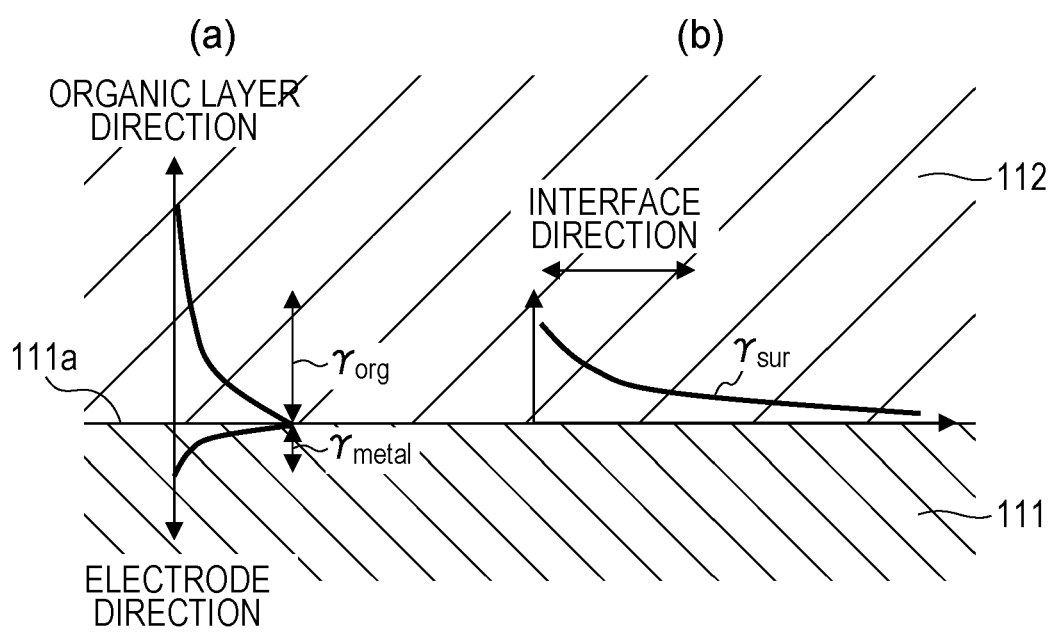
FIG. 4 shows the distribution of an electric field of a surface plasmon.

FIG. 4 schematically shows the intensity distribution of the electric field of the surface plasmon. The electric field of a plasmon generated near the interface 111a between the organic layer 112 and the reflecting electrode 111 is distributed in a direction toward the inside of the reflecting electrode 111, a direction toward the inside of the organic layer 112, and a direction parallel to the interface 111a. FIG. 4(a) shows the intensity distribution of the electric field in a direction toward the inside of the organic layer 112 (organic layer direction) and a direction toward the inside of the reflecting electrode 111 (electrode direction). In FIG. 4(a), the horizontal axis indicates the electric field intensity. FIG. 4(b) shows the intensity distribution of the electric field in a direction parallel to the interface 111a (interface direction). In FIG. 4(b), the vertical axis indicates the electric field intensity. The distances (attenuation distances) at which the electric field intensity is 1/e (e is the base of natural logarithms) in the interface direction, the organic layer direction, and the electrode direction are defined as $\gamma_{sur}$, $\gamma_{org}$, and $\gamma_{metal}$, respectively. According to Journal of Plasma Fusion Research Vol. 84. No. 1 (2008) pp. 10-18, these attenuation distances are represented by formulae (1) to (3) below.

$$\gamma_{sur} = \frac{c}{2\omega}\left[\mathrm{Im}\sqrt{\frac{\varepsilon_{org}\varepsilon_{metal}}{\varepsilon_{org}+\varepsilon_{metal}}}\right]^{-1} \quad (1)$$

$$\gamma_{org} = \frac{c}{2\omega}\left[\mathrm{Im}\sqrt{\frac{\varepsilon_{org}^2}{\varepsilon_{org}+\varepsilon_{metal}}}\right]^{-1} \quad (2)$$

-continued $$\gamma_{metal} = \frac{c}{2\omega} \left[ \text{Im} \sqrt{\frac{\varepsilon_{metal}^2}{\varepsilon_{org} + \varepsilon_{metal}}} \right]^{-1} \quad (3)$$

In the formulae, $\varepsilon_{metal}$ and $\varepsilon_{org}$ represent complex dielectric constants of the reflecting electrode 111 and the organic layer 112, respectively; c represents the speed of light in a vacuum; $\omega(=2\pi c/\lambda)$ represents the angular frequency; λ represents the wavelength; and Im is a function for returning the imaginary part.

Assuming that the refractive index of a certain medium is n, the extinction coefficient is k, the real part of the complex dielectric constant is $\varepsilon_1$, and the imaginary part of the complex dielectric constant is $\varepsilon_2$, the complex refractive index of the medium is generally represented by $n^~=n+ik$ and the complex dielectric constant is generally represented by $\varepsilon_r=\varepsilon_1+i\varepsilon_2$ (i is the imaginary unit). The relationship $n^{~2}=\varepsilon_r$ between the complex refractive index and the complex dielectric constant provides $\varepsilon_1=n^2-k^2$ and $\varepsilon_2=2$ kn. Therefore, the complex dielectric constants $\varepsilon_{metal}$ and $\varepsilon_{org}$ in the above formulae (1) to (3) are determined by the refractive indices and the extinction coefficients of the reflecting electrode 111 and the organic layer 112.

Table 1 shows the calculation results of the attenuation distances $\gamma_{sur}$, $\gamma_{org}$, and $\gamma_{metal}$ with various materials and emission wavelengths of the reflecting electrode 111.

TABLE 1

| | | | | Attenuation distance (1/e) (nm) | | |
| --- | --- | --- | --- | --- | --- | --- |
| Material | Wavelength λ (nm) | Refractive index n | Extinction coefficient k | Interface direction $\gamma_{sur}$ | Organic layer direction $\gamma_{org}$ | Electrode direction $\gamma_{metal}$ |
| Al | 600 | 1.2 | 7.26 | 3027 | 120 | 6 |
|    | 530 | 0.867 | 6.42 | 2451 | 92 | 6 |
|    | 450 | 0.618 | 5.47 | 1711 | 65 | 6 |
| Ag | 620 | 0.131 | 3.88 | 3264 | 60 | 11 |
|    | 520 | 0.130 | 3.07 | 1091 | 37 | 11 |
|    | 460 | 0.144 | 2.56 | 370 | 25 | 11 |
| Cu | 620 | 0.272 | 3.24 | 797 | 48 | 13 |
|    | 520 | 1.12 | 2.6 | 130 | 43 | 13 |
|    | 440 | 1.17 | 2.36 | 90 | 37 | 12 |
| Au | 650 | 0.16 | 3.15 | 1197 | 48 | 14 |
|    | 520 | 0.608 | 2.12 | 67 | 29 | 14 |
|    | 450 | 1.426 | 1.846 | 80 | 48 | 17 |

As is clear from Table 1, the attenuation distance $\gamma_{sur}$ of the plasmon in the interface direction is long in all the metal materials. In particular, the attenuation distance can be some micrometers in Ag and Al often used for an electrode of a light-emitting device. To suppress the generation of such a surface plasmon, the depressions and projections may be formed at a pitch shorter than the attenuation distance. That is, the upper limit of the pitch is desirably about 3 μm. When the light generated in the light-emitting layer is not monochromatic light, but is light having a broad range of wavelengths, the depressions and projections may be formed at a pitch shorter than the attenuation distance calculated using the angular frequency $\omega_{mean}$ (=$2\pi c/\lambda_{mean}$) corresponding to the mean wavelength $\lambda_{mean}$. Herein, the term "mean wavelength" is a certain wavelength in an emission spectrum in which the sum of intensity of light having a wavelength longer than the certain wavelength is equal to the sum of intensity of light having a wavelength shorter than the certain wavelength. In this specification, the frequency $\omega_{mean}$ corresponding to the mean wavelength $\lambda_{mean}$ is sometimes referred to as a "mean frequency".

When the pitch of the depressions and projections is shorter than or equal to half the wavelength of light, the diffraction of light due to the periodical uneven structure is not caused. Such a structure is referred to as a moth-eye structure and is used for an antireflection film. If the pitch of the depressions and projections is, for example, 250 nm or less, the pitch is shorter than or equal to half the wavelength of light having a wavelength of 500 nm. In this case, the amount of light absorbed in the reflecting electrode increases and thus the reflectance decreases, resulting in a decrease in the light extraction efficiency. Therefore, the pitch of the depressions and projections in the reflecting electrode is desirably 250 nm to 3 μm.

Figure 5:
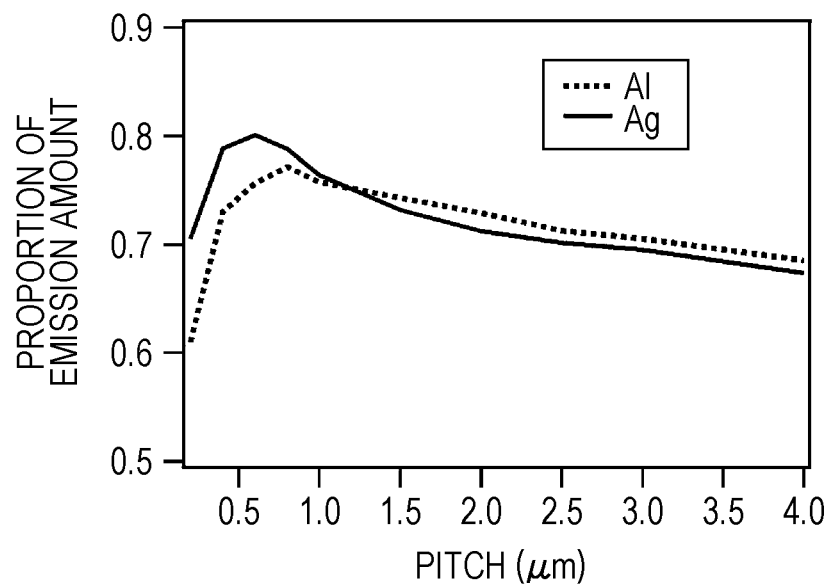
FIG. 5 shows the relationship between the pitch of depressions and projections formed on a reflecting electrode made of Al or Ag and the proportion of an emission amount.

FIG. 5 shows the calculation results of the relationship between the pitch of the depressions and projections and the proportion of the emission amount. The calculation was conducted by a finite-difference time-domain (FDTD) method under the following calculation conditions: the refractive index of the organic layer was 1.8, the material for the reflecting electrode was Ag or Al, the emission wavelength was 500 nm, and the height of the periodical uneven structure was 60 nm. It can be confirmed from FIG. 5 that the emission amount increases at a pitch of approximately 0.25 μm to 3 μm. Note that when there is no uneven structure, the proportion of the emission amount with the reflecting electrode made of Ag is about 0.55 and the proportion of the emission amount with the reflecting electrode made of Al is about 0.65. It has been confirmed that the proportion of the emission amount is increased by disposing such a periodical uneven structure at the interface between the organic layer and the reflecting electrode.

Next, the desirable height of the uneven structure has been studied. As shown in FIG. 4, the electric field of the surface plasmon enters the organic layer at an attenuation distance of about $\gamma_{org}$. Therefore, the height of the uneven structure (i.e. difference in level between the depression and the projection) may be substantially equal to or larger than $\gamma_{org}$ to suppress the generation of the electric field of the surface plasmon. It is found from Table 1 that $\gamma_{org}$ with the reflecting electrode made of Ag or Al is some tens of nanometers to about 120 nm. Thus, the height of the uneven structure may be, for example, 20 nm or more to suppress the generation of the electric field of the surface plasmon. The effect of suppressing the generation of the electric field is considerably produced as the height of the uneven structure increases. It is believed that when the height of the uneven structure is about 120 nm, the generation of the plasmon can be substantially suppressed.

Figure 6:
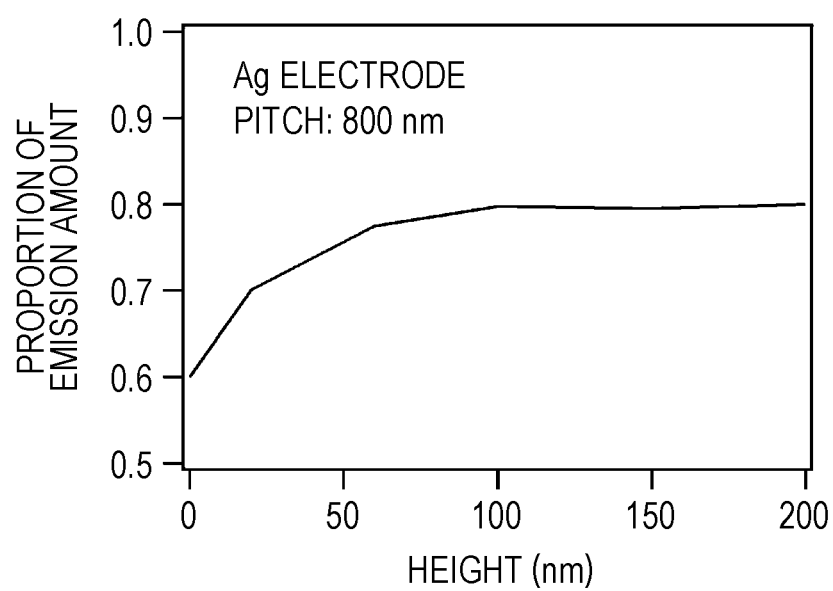
FIG. 6 shows the relationship between the height of depressions and projections formed on a reflecting electrode made of Ag and the proportion of an emission amount.

FIG. 6 shows the relationship between the height of the uneven structure located on the reflecting electrode and the proportion of the emission amount. Herein, the reflecting electrode is made of Ag and the pitch of the uneven structure is 800 nm. It is clear from FIG. 6 that when the height of the uneven structure is about 100 nm or more, the proportion of the emission amount is substantially constant and thus the generation of the plasmon can be substantially suppressed. A plurality of layers constituting the organic layer in the organic EL element each have a thickness of about 20 nm to 100 nm. Therefore, if the height of the uneven structure is more than 100 nm, the height of the uneven structure is larger than the thickness of each of the layers constituting the organic layer adjacent to the uneven structure. In such a case, the organic layer is not formed in a continuous manner or thin portions are locally formed in the organic layer. As a result, a leakage path of an electric current may be formed. Therefore, the height of the uneven structure is desirably 100 nm or less, though depending on the thickness of each of the layers constituting the organic layer.

Structure for Reducing Total Reflection Loss and Efficiently Extracting Light

Figure 7:
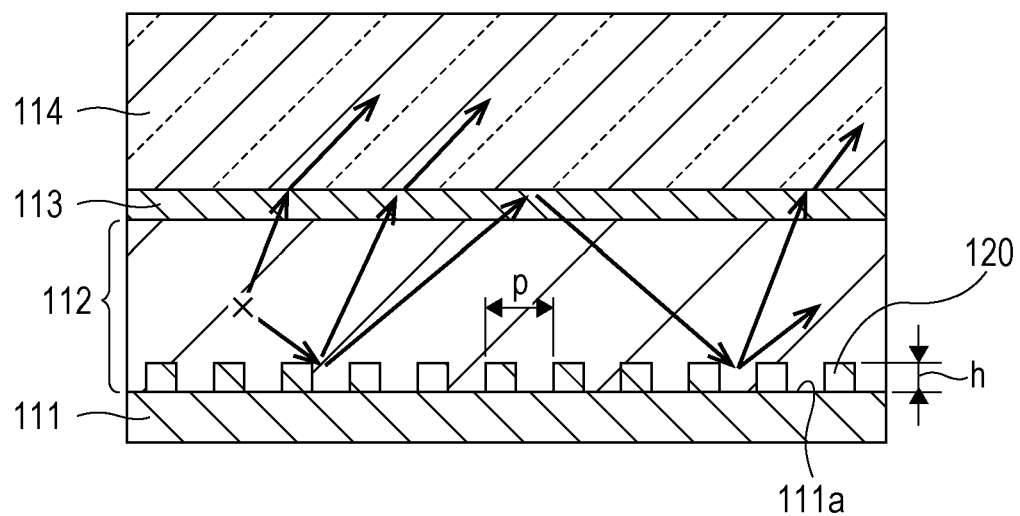
FIG. 7 illustrates paths of light reflected at a reflecting electrode in the organic EL element of FIG. 3.

Next, the proportion (extraction efficiency) of generated light that is extracted to the transparent substrate 114 has been calculated. In general, the refractive index of a substrate is about 1.5, which is smaller than the refractive index (about 1.7 to 2.0) of an organic layer or a transparent electrode. Therefore, part of light is subjected to total reflection before reaching the substrate and thus cannot be extracted. However, the total reflection can be suppressed by disposing the uneven structure at the interface 111a between the reflecting electrode 111 and the organic layer 112 as illustrated in FIG. 7. With the uneven structure, light to be reflected at the reflecting electrode 111 can be diffracted. The light emitted from the light emission point in the organic layer 112 can be made to enter the transparent electrode 113 and the substrate 114 at an angle closer to 90° with respect to the principal surfaces of the transparent electrode 113 and the substrate 114. Thus, the light extraction efficiency can be improved.

Figure 8:
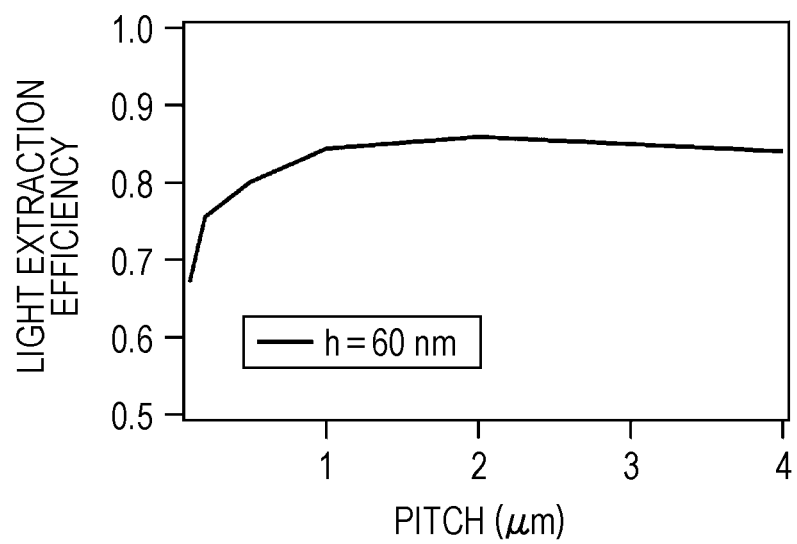
FIG. 8 shows the relationship between the pitch of depressions and projections and the light extraction efficiency in the organic EL element of FIG. 3.
Figure 9:
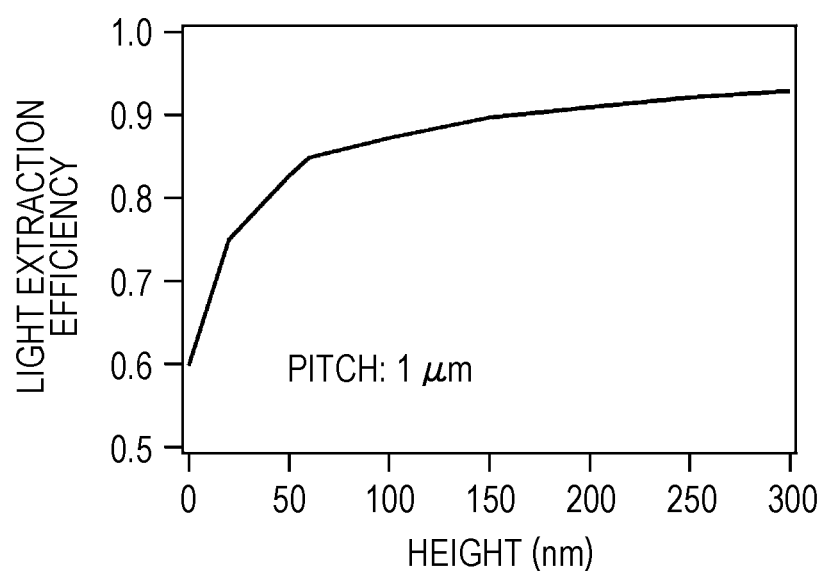
FIG. 9 shows the relationship between the height of depressions and projections and the light extraction efficiency in the organic EL element of FIG. 3.

FIG. 8 shows the relationship between the pitch of the depressions and projections and the proportion of generated light that is extracted to the substrate 114 (extraction efficiency) in the case where a periodical uneven structure having a height of 60 nm is located at the interface 111a between the reflecting electrode 111 and the organic layer 112. FIG. 9 shows the relationship between the height of the uneven structure and the efficiency of extracting light to the substrate 114 at a pitch of 1 µm. As is clear from FIG. 8, the extraction efficiency increases when the pitch of the depressions and projections is 1 µm or more. As is also clear from FIG. 9, the extraction efficiency increases when the height of the uneven structure is 100 nm or more.

Amount of Light Extracted to Substrate

In FIGS. 5 and 6, the change in the emission amount due to the uneven structure is calculated. In FIGS. 8 and 9, the extraction efficiency of emitted light is calculated. The amount of light extracted to the substrate in the end can be calculated by (emission amount)×(extraction efficiency). The calculation result of the amount of light extracted to the substrate is shown in Reference Example 1 of FIG. 14. The maximum amount of light extracted to the substrate is about 63%. As is clear from the comparison between the emission amount in FIG. 5 and the extraction efficiency in FIG. 8, the optimum pitches of the depressions and projections are different between the case of the emission amount and the case of the extraction efficiency. That is, there are other structures that further improve the extraction efficiency.

Figure 10:
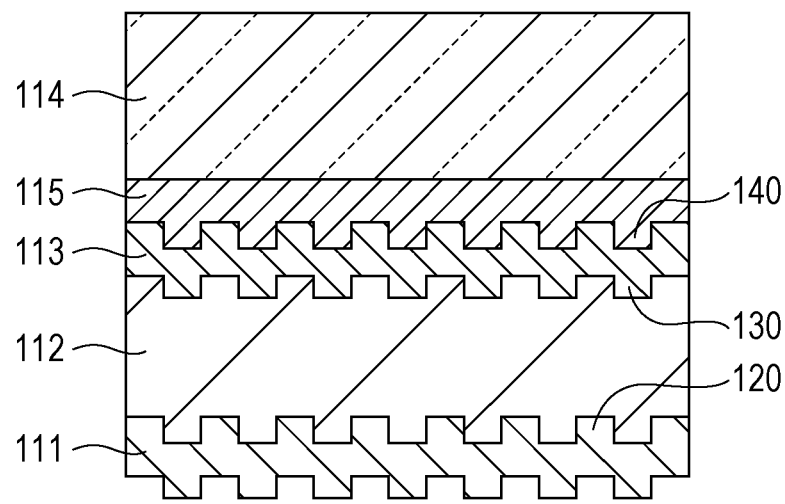
FIG. 10 illustrates a sectional structure of an organic EL element disclosed in Patent Document 3.

The total reflection loss can be further reduced compared with the structure of FIG. 7 by employing the structure (FIG. 10) disclosed in Patent Document 3, that is, a structure further including the uneven shape at an interface between the transparent electrode 113 and the transparent substrate (curable transparent resin) 114. However, when the height of the uneven shape is about 100 nm, the light that passes through the uneven shape is substantially not affected by the phase difference. Consequently, almost no effect of suppressing the total reflection loss is produced. For example, assuming that the light has a wavelength of 550 nm, the refractive index of the resin is 1.5, and the refractive index of the transparent electrode is 1.8, the phase difference of light that passes through the uneven shape having a height of 100 nm is expressed as $2\pi \times (1.8-1.5) \times 100$ nm/550 nm≅$0.1\pi$. In this case, light is substantially not diffracted because the phase difference is much smaller than $\pi$ at which the optimum diffraction efficiency is achieved. In other words, the structure of FIG. 10 provides almost no effects of reducing the total reflection loss due to the uneven shape located at the interface between the transparent electrode 113 and the curable transparent resin 114 and efficiently extracting light. The total reflection loss is reduced by the periodical uneven structure located at the interface 111a of the reflecting electrode 111, and light is extracted.

Thus, it is considered that high extraction efficiency is achieved by increasing the height of the uneven structure. However, if the height of the uneven structure is 100 nm or more in the structure of FIG. 10, each layer (having a thickness of several tens of nanometers to several hundred nanometers) in the light-emitting element is sometimes not properly formed.

As a result of the above studies, the present inventors have conceived a light-emitting device having a novel structure in which the total reflection loss can be reduced while the efficiency is improved by suppressing the generation of the surface plasmon. The outline of embodiments according to the present disclosure is as follows.

The present disclosure includes light-emitting devices and production methods according to the following aspects.

[First Aspect]

A light-emitting device includes a light-emitting element including a transparent electrode, a reflecting electrode, and an organic layer that includes a light-emitting layer and is sandwiched between the transparent electrode and the reflecting electrode; a transparent multilayer body including a low-refractive-index layer and a high-refractive-index layer, the high-refractive-index layer having higher refractive index than that of the low-refractive-index layer and being provided in contact with the transparent electrode; a first uneven structure at an interface between the low-refractive-index layer and the high-refractive-index layer, the first uneven structure including depressions and projections, a height of each of the projections relative to the depressions being 400 nm or more; and a second uneven structure at an interface between the reflecting electrode and the organic layer, the second uneven structure including depressions and projections, a height of each of the projections relative to the depressions in the second uneven structure being 20 nm or more and 100 nm or less.

This can suppress the generation of the surface plasmon and the total reflection loss caused when light is emitted to the outside from the light-emitting element. Consequently, light generated in the light-emitting layer can be efficiently extracted to the outside.

[Second Aspect]

In the light-emitting device according to the first aspect, the first uneven structure has a shape in which the depressions and the projections are two-dimensionally arranged in a periodical manner, and the first uneven structure has an average pitch of 800 nm or more and 6 µm or less.

This can improve the light extraction efficiency in a visible range.

[Third Aspect]

In the light-emitting device according to the first aspect or the second aspect, the second uneven structure has a shape in which the depressions and the projections are two-dimensionally arranged in a periodical manner, and the second uneven structure has an average pitch of 200 nm or more and 3 µm or less.

This can effectively suppress the generation of the surface plasmon.

[Fourth Aspect]

In the light-emitting device according to any one of the first aspect to the third aspect, at least one of the first uneven structure and the second uneven structure has an uneven shape in which the depressions and the projections are arranged in a periodical manner.

Thus, a light-emitting device having a high light extraction efficiency can be relatively easily produced.

[Fifth Aspect]

In the light-emitting device according to the first aspect, the first uneven structure has an uneven shape in which the depressions and the projections are two-dimensionally arranged in a random manner.

This can suppress the color irregularity and nonuniform brightness of light emitted from the light-emitting device.

[Sixth Aspect]

In the light-emitting device according to the fifth aspect, assuming that a minimum length of minor axes of ellipses inscribed in the depressions and the projections in the first uneven structure is w, the amount of pitch components with larger than 2 w among pitch components of a pattern of the uneven shape is reduced compared with a case where the depressions and the projections are randomly arranged.

This can further improve the light extraction efficiency while suppressing the color irregularity and nonuniform brightness.

[Seventh Aspect]

In the light-emitting device according to the sixth aspect, w in the first uneven structure is 400 nm or more and 3 µm or less.

Thus, the average pitch is set to be in the desirable range, and the light extraction efficiency can be increased.

[Eighth Aspect]

In the light-emitting device according to any one of the first aspect to the seventh aspect, the second uneven structure has a shape in which the depressions and the projections are two-dimensionally arranged in a periodical manner.

Thus, a light-emitting device having a high light extraction efficiency can be relatively easily produced.

[Ninth Aspect]

In the light-emitting device according to any one of the first aspect to the seventh aspect, the second uneven structure has an uneven shape in which the depressions and the projections are two-dimensionally arranged in a random manner.

This can achieve a light-emitting device in which color irregularity and nonuniform brightness are suppressed while the emission efficiency is improved by suppressing the influence of the surface plasmon.

[Tenth Aspect]

In the light-emitting device according to the ninth aspect, assuming that a minimum length of minor axes of ellipses inscribed in the depressions and the projections in the second uneven structure is w, the amount of pitch components with larger than 2 w among pitch components of a pattern in the second uneven structure is reduced compared with a case where the depressions and the projections are randomly arranged.

This can suppress the formation of structures having a large pitch and thus can further suppress the influence of the surface plasmon.

[Eleventh Aspect]

In the light-emitting device according to the ninth aspect or the tenth aspect, w in the second uneven structure is 100 nm or more and 3000 nm or less.

This can suppress the formation of structures having a large pitch and thus can further suppress the influence of the surface plasmon.

[Twelfth Aspect]

In the light-emitting device according to any one of the ninth aspect to the eleventh aspect, the second uneven structure is formed so that a predetermined number of depressions or projections or more are not continuously arranged in an arrangement direction.

This can suppress the formation of structures having a large pitch and thus can further suppress the influence of the surface plasmon.

[Thirteenth Aspect]

In the light-emitting device according to any one of the first aspect to the twelfth aspect, a pattern of the first uneven structure is identical to a pattern of the second uneven structure.

[Fourteenth Aspect]

In the light-emitting device according to any one of the ninth aspect to the thirteenth aspect, the first uneven structure and the second uneven structure have the same uneven pattern in which the depressions and the projections are arranged in a random manner.

[Fifteenth Aspect]

In the light-emitting device according to any one of the ninth aspect to the fourteenth aspect, a sectional shape obtained by cutting each of the depressions and the projections along a plane parallel to an interface is a quadrilateral.

[Sixteenth Aspect]

In the light-emitting device according to the fifteenth aspect, the uneven structure is formed so that three or more depressions or projections are not continuously arranged in an arrangement direction.

[Seventeenth Aspect]

In the light-emitting device according to any one of the ninth aspect to the fourteenth aspect, a sectional shape obtained by cutting each of the depressions and the projections along a plane parallel to an interface is a hexagon.

[Eighteenth Aspect]

In the light-emitting device according to the seventeenth aspect, the uneven structure is formed so that four or more depressions or projections are not continuously arranged in an arrangement direction.

[Nineteenth Aspect]

In the light-emitting device according to any one of the first aspect to the eighteenth aspect, an average pitch in the second uneven structure is smaller than $$\gamma_{sur} = \frac{c}{2\omega}\left[\text{Im}\sqrt{\frac{\varepsilon_{org}\varepsilon_{metal}}{\varepsilon_{org} + \varepsilon_{metal}}}\right]^{-1}$$

where $\varepsilon_{org}$ represents a complex dielectric constant of the organic layer, $\varepsilon_{metal}$ represents a complex dielectric constant of the reflecting electrode, ω represents an average emission frequency, and c represents a speed of light in a vacuum.

[Twentieth Aspect]

In the light-emitting device according to any one of the first aspect to the eighteenth aspect, a difference in level between the depressions and the projections is larger than $$\gamma_{org} = \frac{c}{2\omega} \left[ \mathrm{Im} \sqrt{\frac{\varepsilon_{org}^2}{\varepsilon_{org} + \varepsilon_{metal}}} \right]^{-1}$$

where $\in_{org}$ represents a complex dielectric constant of the organic layer, $\in_{metal}$ represents a complex dielectric constant of the reflecting electrode, ω represents an average emission frequency, and c represents a speed of light in a vacuum.

[Twenty-First Aspect]

A method for producing a light-emitting device includes a step of forming a low-refractive-index layer including a first uneven structure on a substrate; a step of filling the first uneven structure of the low-refractive-index layer with a high-refractive-index material; a step of forming a high-refractive-index layer by forming a different uneven structure on a surface of the high-refractive-index material; and a step of forming a light-emitting element including a second uneven structure by stacking a transparent electrode, an organic layer, and a reflecting electrode on the high-refractive-index layer, the second uneven structure having the same pitch and height as those of the different uneven structure and being formed at an interface between the organic layer and the reflecting electrode, wherein a height of projections relative to depressions in the first uneven structure is 400 nm or more, and a height of each of the projections relative to the depressions in the second uneven structure is 20 nm or more and 100 nm or less.

[Twenty-Second Aspect]

A method for producing a light-emitting device includes a step of forming an uneven structure on a surface of a substrate; a step of forming a reflecting electrode on the uneven structure of the substrate so that the reflecting electrode has an uneven structure having the same pitch and height as those of the uneven structure; a step of forming an organic layer on the reflecting electrode and forming a transparent electrode on the organic layer to complete a light-emitting element on the substrate; a step of filling a surface of the transparent electrode with a high-refractive-index material; a step of planarizing a surface of the high-refractive-index material; a step of forming a different uneven structure on the planarized surface of the high-refractive-index material to complete a high-refractive-index layer including the different uneven structure; and a step of filling the different uneven structure of the high-refractive-index layer with a low-refractive-index material and planarizing a surface of the low-refractive-index material to complete a low-refractive-index layer, wherein a height of projections relative to depressions in an uneven structure located at an interface between the high-refractive-index layer and the low-refractive-index layer is 400 nm or more, and a height of each of the projections relative to the depressions in an uneven structure located at an interface between the reflecting electrode and the organic layer is 20 nm or more and 100 nm or less.

[Twenty-Third Aspect]

A method for producing a light-emitting device includes a step of forming a low-refractive-index layer including a first uneven structure on a substrate; a step of filling the first uneven structure of the low-refractive-index layer with a high-refractive-index material to form a high-refractive-index layer including a different uneven structure whose height of projections is smaller than that of the first uneven structure; and a step of forming a light-emitting element including a second uneven structure by stacking a transparent electrode, an organic layer, and a reflecting electrode on the high-refractive-index layer, the second uneven structure having the same pitch and height as those of the different uneven structure and being formed at an interface between the organic layer and the reflecting electrode, wherein a height of projections relative to depressions in the first uneven structure is 400 nm or more, and a height of each of the projections relative to the depressions in the second uneven structure is 20 nm or more and 100 nm or less.

Hereafter, specific embodiments of the present disclosure will be described.

First Embodiment

1. Structure

A light-emitting device according to a first embodiment of the present disclosure will be described below. In this embodiment, a light-emitting device that uses an organic EL element is described as an example.

Figure 11:
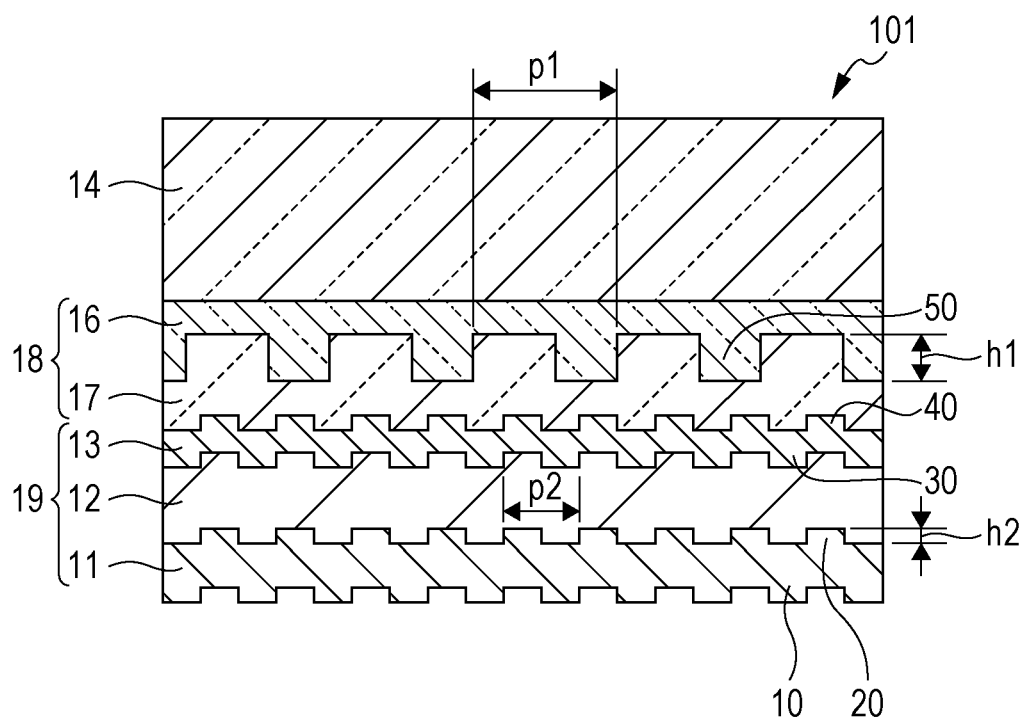
FIG. 11 is a sectional view of a light-emitting device according to a first embodiment.

FIG. 11 is a sectional view schematically illustrating a structure of a light-emitting device 101 of this embodiment. The light-emitting device 101 of this embodiment includes a light-emitting element 19 and a transparent multilayer body 18. The light-emitting element 19 is an organic EL element. The light-emitting element 19 includes a transparent electrode 13, a reflecting electrode 11, and an organic layer 12 sandwiched between the transparent electrode 13 and the reflecting electrode 11. The organic layer 12 includes a light-emitting layer.

The reflecting electrode 11 is an electrode (cathode) for injecting electrons into the light-emitting layer of the organic layer 12. When a certain voltage is applied between the reflecting electrode 11 and the transparent electrode 13, electrons are injected from the reflecting electrode 11 into the light-emitting layer of the organic layer 12. The reflecting electrode 11 may be made of, for example, silver (Ag), aluminum (Al), copper (Cu), magnesium (Mg), lithium (Li), or sodium (Na) or an alloy mainly containing the foregoing metal. Alternatively, the reflecting electrode 11 may be formed by stacking these metals in a combined manner.

The transparent electrode 13 is an electrode (anode) for injecting holes into the light-emitting layer of the organic layer 12. The transparent electrode 13 is made of a material such as a metal, an alloy, or an electrically conductive compound each having a relatively high work function, or a mixture of any of the foregoing. Examples of the material for the transparent electrode 13 include: inorganic compounds such as indium tin oxide (ITO), tin oxide, zinc oxide, indium zinc oxide (IZO, registered trademark), and copper iodide; conductive polymers such as poly(3,4-ethylenedioxythiophene) (PEDOT) and polyaniline; conductive polymers doped with a desired acceptor; and conductive light-transmissive materials such as carbon nanotube.

The transparent electrode 13 can be formed as a thin film by, for example, a sputtering method, a vacuum deposition method, or a coating method. The sheet resistance of the transparent electrode 13 may be set to several hundred ohms per square or less in one example and one hundred ohms per square or less in another example. The thickness of the transparent electrode 13 may be set to 500 nm or less in one example and 10 to 200 nm in another example. The light transmittance increases as the thickness of the transparent electrode 13 decreases. However, the sheet resistance increases inversely with the thickness, and thus the sheet resistance increases as the thickness decreases. This may cause, when the area of the light-emitting device 101 is increased, an excessive increase in the voltage or nonuniform brightness caused as a result of uneven current density due to voltage drop. To avoid this tradeoff, an auxiliary wiring line (grid) made of a metal or the like may be formed on the transparent electrode 13. The auxiliary wiring line may be made of a conductive material such as Ag, Cu, Au, Al, Rh, Ru, Ni, Mo, Cr, or Pd or an alloy (e.g., MoAlMo, AlMo, or AgPdCu) thereof. Herein, an insulating treatment for preventing an electric current from flowing through a grid portion may be performed such that the metal grid does not serve as a light-shielding material. Furthermore, a metal having a high reflectance may be used for the grid to prevent diffused light from being absorbed into the grid. In this embodiment, the transparent electrode 13 is an anode and the reflecting electrode 11 is a cathode. However, the polarities of these electrodes may be opposite.

The light-emitting layer is formed of a material that generates light by the recombination of electrons injected from the reflecting electrode 11 and holes injected from the transparent electrode 13. The light-emitting layer may be made of any publicly known light-emitting material such as a low-molecular-weight or high-molecular-weight light-emitting material or a metal complex. Although not illustrated in FIG. 11, the organic layer 12 may further include an electron transport layer and a hole transport layer which are located so as to sandwich the light-emitting layer. The electron transport layer is located on the reflecting electrode 11 (cathode) side and the hole transport layer is located on the transparent electrode 13 (anode) side. If the reflecting electrode 11 is an anode, the electron transport layer is located on the transparent electrode 13 side and the hole transport layer is located on the reflecting electrode 11 side. The electron transport layer may be made of a material suitably selected from the group of compounds having an electron-transporting property. Examples of the compounds include metal complexes such as $Alq_3$ known as an electron-transporting material; and heterocyclic compounds such as phenanthroline derivatives, pyridine derivatives, tetrazine derivatives, and oxadiazole derivatives. The material for the electron transport layer is not limited to these materials, and may be any publicly known electron-transporting material. The hole transport layer may be made of a material suitably selected from the group of compounds having a hole-transporting property. Examples of the compounds include triarylamine compounds such as 4,4'-bis[N-(naphthyl)-N-phenyl-amino]biphenyl (α-NPD), N,N'-bis(3-methylphenyl)-(1,1'-biphenyl)-4,4'-diamine (TPD), 2-TNATA, 4,4',4"-tris(N-(3-methylphenyl)-N-phenylamino)triphenylamine (MTDATA), 4,4'-N,N'-dicarbazolebiphenyl (CBP), Spiro-NPD, spiro-TPD, spiro-TAD, and TNB; amine compounds having a carbazole group; and amine compounds including a fluorene derivative. The material for the hole transport layer is not limited to these materials, and may be any publicly known hole-transporting material. As described above, in addition to the light-emitting layer, other layers such as the electron transport layer and the hole transport layer may be located between the reflecting electrode 11 and the transparent electrode 13.

The structure of the organic layer 12 is not limited to the above example, and the organic layer 12 may have various structures. For example, the organic layer 12 may have a multilayer structure including the hole transport layer and the light-emitting layer or a multilayer structure including the light-emitting layer and the electron transport layer. Furthermore, a hole injection layer may be located between the anode and the hole transport layer, and an electron injection layer may be located between the cathode and the electron transport layer. The structure of the light-emitting layer is not limited to a single-layer structure, and may be a multilayer structure. For example, when a desired emission color is white, three types of dopant dyes of red, green, and blue may be doped into the light-emitting layer. The light-emitting layer may also have a multilayer structure including a hole-transporting blue light-emitting layer, an electron-transporting green light-emitting layer, and an electron-transporting red light-emitting layer. Or the light-emitting layer may have a multilayer structure including an electron-transporting blue light-emitting layer, an electron-transporting green light-emitting layer, and an electron-transporting red light-emitting layer. Furthermore, a multilayer structure in which a plurality of light-emitting units and light-transmissive and conductive intermediate layers are alternately stacked (i.e. a multi-unit structure including light-emitting units electrically connected to each other in series) may be employed. The light-emitting units each include an anode, a cathode, and a light-emitting element that is sandwiched between the anode and the cathode and emits light upon voltage application.

The transparent multilayer body 18 includes a low-refractive-index layer 16 and a high-refractive-index layer 17. The high-refractive-index layer 17 is located so as to be in contact with the transparent electrode 13. In this embodiment, the light-emitting device 101 further includes a substrate 14, which is located on the surface of the transparent multilayer body 18 on the side remote from the light-emitting element 19. The low-refractive-index layer 16 is in contact with the substrate 14. The transparent multilayer body 18 and the substrate 14 have transparency to light emitted from the light-emitting element 19.

The low-refractive-index layer 16 may only have a refractive index lower than that of the high-refractive-index layer 17 and desirably has a refractive index lower than that of the substrate 14. The low-refractive-index layer 16 may be made of an inorganic material such as $SiO_2$ or glass, a resin, or the like. The thickness of the low-refractive-index layer 16 does not affect the optical properties, but is set to about several micrometers to several tens of micrometers in consideration of formation by a coating process, a semiconductor process, or the like.

The refractive index of the high-refractive-index layer 17 is desirably higher than that of the light-emitting layer, and is, for example, 1.7 or more. The high-refractive-index layer 17 may be made of a high-refractive-index resin or an inorganic material having a relatively high refractive index, such as indium tin oxide (ITO), titanium oxide ($TiO_2$), silicon nitride (SiN), tantalum pentoxide ($Ta_2O_5$), or zirconia ($ZrO_2$). The thickness of the high-refractive-index layer 17 does not affect the optical properties, but is set to about several micrometers to several tens of micrometers in consideration of formation by a coating process, a semiconductor process, or the like.

The substrate 14 is a member for supporting the transparent multilayer body 18 and the light-emitting layer 19. The substrate 14 may be made of a transparent material such as glass or resin. The substrate 14 has a refractive index of, for example, about 1.45 to 1.65, but may be a high-refractive-index substrate having a refractive index of 1.65 or more or a low-refractive-index substrate having a refractive index of less than 1.45.

The light-emitting device 101 includes a first uneven structure 50 and a second uneven structure 20 in order to increase the efficiency of extracting light generated in the light-emitting layer of the light-emitting element 19 to the outside. The first uneven structure 50 reduces the total reflection loss caused when light is emitted from the light-emitting element to the outside, and the second uneven structure 20 suppresses a plasmon. Therefore, the first uneven structure 50 is located at an interface between the low-refractive-index layer 16 and the high-refractive-index layer 17 of the transparent multilayer body 18. Since the decrease in the emission efficiency due to the plasmon occurs near the interface between the organic layer 12 and the reflecting electrode 11, the uneven structure 20 may be located at least at the interface between the organic layer 12 and the reflecting electrode 11. In the case where it is difficult to form the shape of the second uneven structure 20 by directly processing the interface between the organic layer 12 and the reflecting electrode 11, the following process may be performed. That is, a structure having the same shape as the second uneven structure 20 is formed on a surface of another layer. Layers of the light-emitting element 19 are deposited so as to each have the shape. Thus, the second uneven structure 20 is formed at the interface between the organic layer 12 and the reflecting electrode 11.

In the light-emitting device 101 of this embodiment, first, an uneven structure 40 having the same shape as the second uneven structure is formed at the interface between the high-refractive-index layer 17 of the transparent multilayer body 18 and the transparent electrode 13 of the light-emitting element 19, and then the layers of the light-emitting element 19 are formed so as to each have the shape. Therefore, an uneven structure 30 having the same shape as the second uneven structure is also formed at the interface between the transparent electrode 13 and the organic layer 12. An uneven structure 10 having the same shape as the second uneven structure is also formed on the surface of the reflecting electrode 11 on the side remote from the organic layer 12.

As described above, the height of the second uneven structure 20, which is a difference in level between depressions and projections, provided to produce the effect of suppressing the plasmon is not so large. Therefore, the diffraction effect is substantially not produced at the uneven structure 30 and the uneven structure 40, and thus the influence of the uneven structure 30 and the uneven structure 40 on diffraction of light at the interface is small.

In this embodiment, the first uneven structure 50 is a periodical structure in which a plurality of depressions and a plurality of projections are two-dimensionally arranged in an alternate manner. The first uneven structure 50 has two different levels, and thus spaces between projections are called depressions and portions between depressions are called projections. In the first uneven structure 50, square depressions and square projections are two-dimensionally arranged in an alternate manner along a surface parallel to the interface between the low-refractive-index layer 16 and the high-refractive-index layer 17.

The height h1 of the projections relative to the depressions illustrated in FIG. 11 is 400 nm or more. The pitch p1 in an arrangement direction is 800 nm or more and 6 µm or less. The first uneven structure 50 with the height h1 and the pitch p1 in the above ranges has a higher light extraction efficiency in a visible range.

The transparent electrode 13 of the light-emitting element 19 is in contact with the high-refractive-index layer 17 of the transparent multilayer body 18 on the side remote from the organic layer 12. Thus, the total reflection of the light generated in the light-emitting element 19 is suppressed at the interface between the transparent electrode 13 and the high-refractive-index layer 17, and the light efficiently propagates to the transparent multilayer body 18. The light that enters the transparent multilayer body 18 from the light-emitting element 19 is diffracted at the first uneven structure 50 and enters the low-refractive-index layer 16 in a direction closer to 90° relative to the low-refractive-index layer 16. Therefore, the total reflection at the interface between the low-refractive-index layer 16 and the high-refractive-index layer 17 is suppressed, and a large amount of light can be emitted from the substrate 14.

In this embodiment, the second uneven structure 20 is also a structure in which a plurality of depressions and a plurality of projections are two-dimensionally arranged in an alternate manner. The second uneven structure 20 has two different levels, and thus spaces between projections are called depressions and portions between depressions are called projections. In the second uneven structure 20, square depressions and square projections are two-dimensionally arranged in an alternate manner along a surface parallel to the interface between the organic layer 12 and the reflecting electrode 11.

The height h2 of the projections relative to the depressions illustrated in FIG. 11 is 20 nm or more and 100 nm or less. The pitch p2 in an arrangement direction is 50 nm or more and 0.75 µm or less. As described above, when the second uneven structure 20 has the height h2 and the pitch p2 in the above ranges, the generation of the surface plasmon can be suppressed and the light generated in the light-emitting layer of the organic layer 12 can be efficiently extracted to the outside of the organic layer 12. The first uneven structure 50 and the second uneven structure 20 are located in the light-emitting device 101 for different purposes and have different heights of projections relative to depressions and different pitches.

Although the light-emitting device 101 of this embodiment includes the substrate 14, the substrate 14 is not necessarily provided. Furthermore, for example, the light that has reached the substrate 14 may be directly extracted to the outside of the light-emitting device 101 through the surface of the substrate 14 or may be extracted to the outside of the light-emitting device 101 using a light extraction film located on the front surface (or back surface) of the substrate 14.

2. Detailed Examination of Structure

In order to evaluate the light extraction efficiency of the light-emitting device 101 of this embodiment, the amounts of light that reached the substrate 14 in FIG. 11 were calculated by changing the pitches and the heights of the first uneven structure 50 and the second uneven structure 20. The calculation results are shown below. Furthermore, the amounts of light that reached the substrate 14 in light-emitting devices including structures of Reference Examples were also calculated.

Example 1

A light-emitting device of Example 1 having a structure illustrated in FIG. 11 was examined. The heights of the first uneven structure 50 and the second uneven structure 20 are 600 nm and 60 nm, respectively. The second uneven structure 20 has a pitch of 800 nm. The electrode is mainly made of Ag or Al.

Example 2

Figure 12:
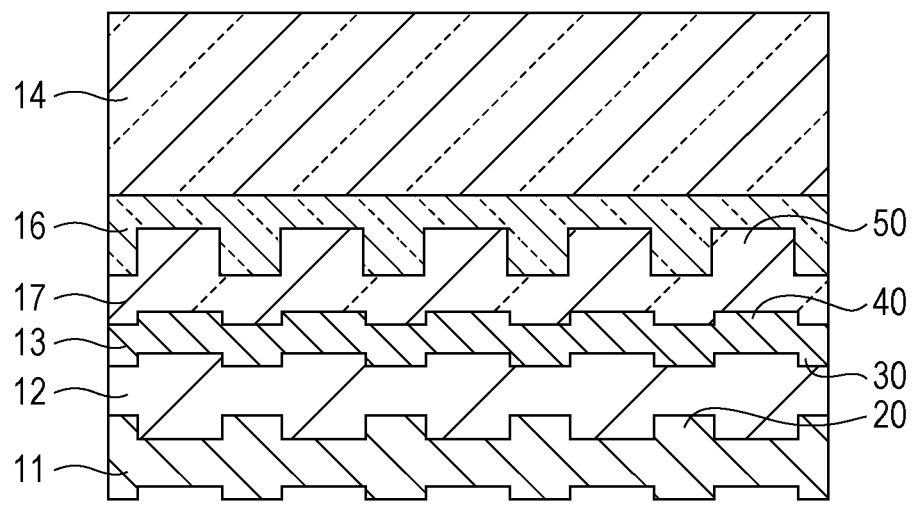
FIG. 12 is a sectional view of a light-emitting device of Example 2.

A light-emitting device of Example 2 having a structure illustrated in FIG. 12 was examined. The light-emitting device of Example 2 includes, as in the light-emitting device of this embodiment illustrated in FIG. 11, a first uneven structure 50 located between a low-refractive-index layer 16 and a high-refractive-index layer 17 and a second uneven structure 20 located between an organic layer 12 and a reflecting electrode 11. The light-emitting device also includes an uneven structure 40 located between the high-refractive-index layer 17 and a transparent electrode 13 and an uneven structure 30 located between the transparent electrode 13 and the organic layer 12. The pitches of the uneven structures are the same. The heights of the first uneven structure 50 and the second uneven structure 20 are 600 nm and 60 nm, respectively. The electrode is mainly made of Ag or Al.

Example 3

A light-emitting device of Example 3 having a structure illustrated in FIG. 11 was examined. The pitches of the first uneven structure 50 and the second uneven structure 20 are 1 μm and 800 nm, respectively. The height of the second uneven structure 20 is 60 nm. The electrode is mainly made of Al.

Example 4

A light-emitting device of Example 4 having a structure illustrated in FIG. 11 was examined. The pitch of the first uneven structure 50 is 2 μm. The heights of the first uneven structure 50 and the second uneven structure 20 are 600 nm and 60 nm, respectively. The electrode is mainly made of Al.

Reference Example 1

A light-emitting device of Reference Example 1 having a structure illustrated in FIG. 3 was examined. The light-emitting device of Reference Example 1 includes only a second uneven structure 120 located between an organic layer 112 and a reflecting electrode 111. The height of the second uneven structure 120 is 100 nm.

Reference Example 2

Figure 13:
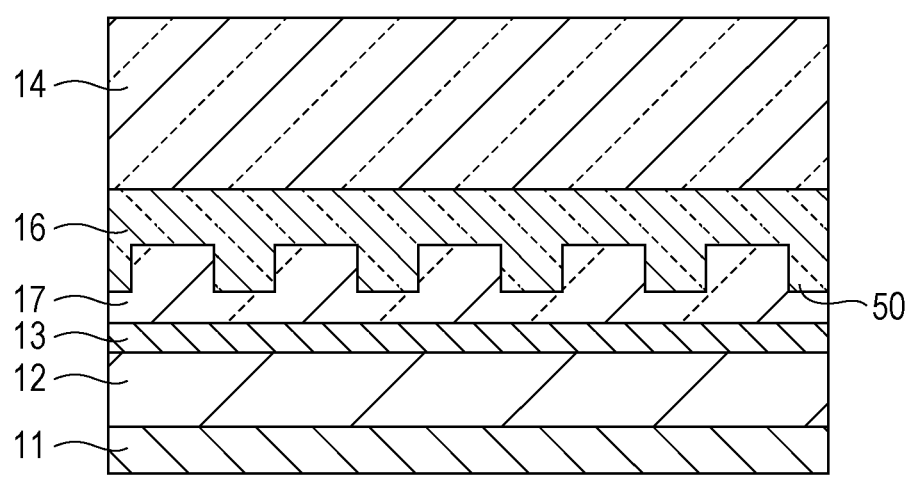
FIG. 13 is a sectional view of a light-emitting device of another Reference Example.

A light-emitting device of Reference Example 2 having a structure illustrated in FIG. 13 was examined. The light-emitting device of Reference Example 2 includes only a first uneven structure 150 located between a low-refractive-index layer 116 and a high-refractive-index layer 117. The height of the first uneven structure 150 is 600 nm.

Reference Example 3

A light-emitting device of Reference Example 3 having a structure illustrated in FIG. 3 was examined. The light-emitting device of Reference Example 3 includes only a second uneven structure 120 located between an organic layer 112 and a reflecting electrode 111. The pitch of the second uneven structure 120 is 800 nm and the height of the second uneven structure 120 is 100 nm.

Reference Example 4

A light-emitting device of Reference Example 4 having a structure illustrated in FIG. 13 was examined. The light-emitting device of Reference Example 4 includes only a first uneven structure 150 located between a low-refractive-index layer 116 and a high-refractive-index layer 117. The pitch of the first uneven structure 150 is 1 μm.

Figure 14:
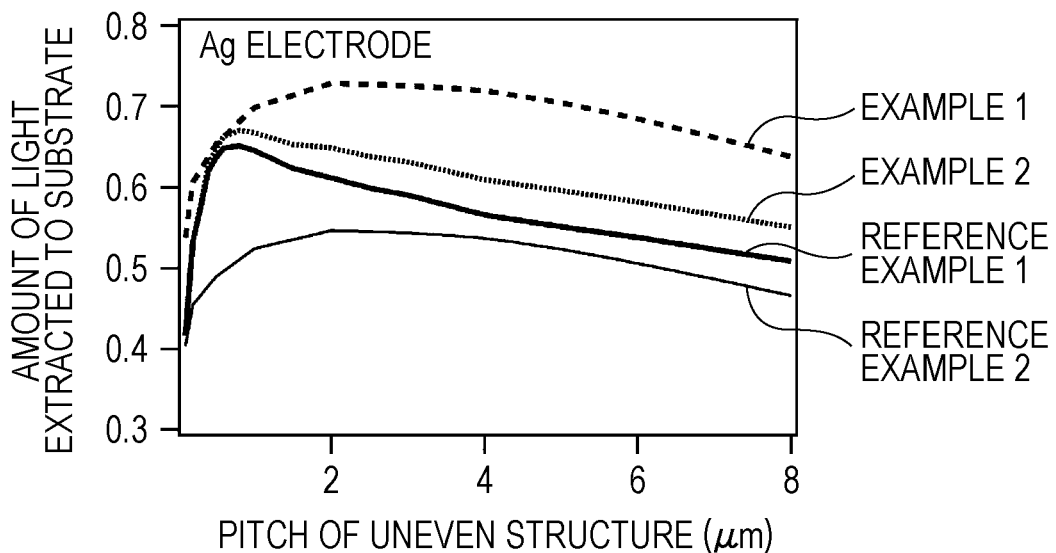
FIG. 14 shows the relationship between the pitch of a first uneven structure and the amount of light extracted through a substrate in light-emitting devices of Examples.

FIG. 14 shows the relationship between the pitch of the first uneven structure and the amount of light extracted to the substrate in the case where the reflecting electrode is made of Ag. Note that, for Example 2, both pitches of the first and second uneven structures 50 and 20 are changed so that those pitches are the same. For the Reference Example 1, the pitch of the second uneven structure 120 is changed since the Reference Example 1 does not have a first uneven structure. It is clear from FIG. 14 that the light-emitting device of Example 1 can emit a larger amount of light than the light-emitting device of Reference Example 1 including only the second uneven structure and the light-emitting device of Reference Example 2 including only the first uneven structure in the entire range of the pitch (0.05 μm to 8 μm) shown in FIG. 14. In particular, the emission amount is larger than the peak emission amount of Reference Example 1 in the range of the pitch of 0.4 μm to 8 μm. Furthermore, an emission amount of 0.7 or more, which is larger than that in the case where the reflecting electrode is made of Al, is achieved in the range of 1 μm to 5 μm. This is because Ag absorbs a smaller amount of light and thus the extraction efficiency is considerably improved.

A large emission amount can also be achieved with the light-emitting device of Example 2 in the range of 0.4 μm to 8 μm. In particular, the emission amount is larger than the peak emission amount of Reference Example 1 in the range of the pitch of 0.4 μm (400 nm) to 2 μm. The light-emitting device of Example 1 emits a larger amount of light than the light-emitting device of Example 2 because the pitch of the second uneven structure is set to 800 nm, which produces a large effect of suppressing the plasmon.

Figure 15:
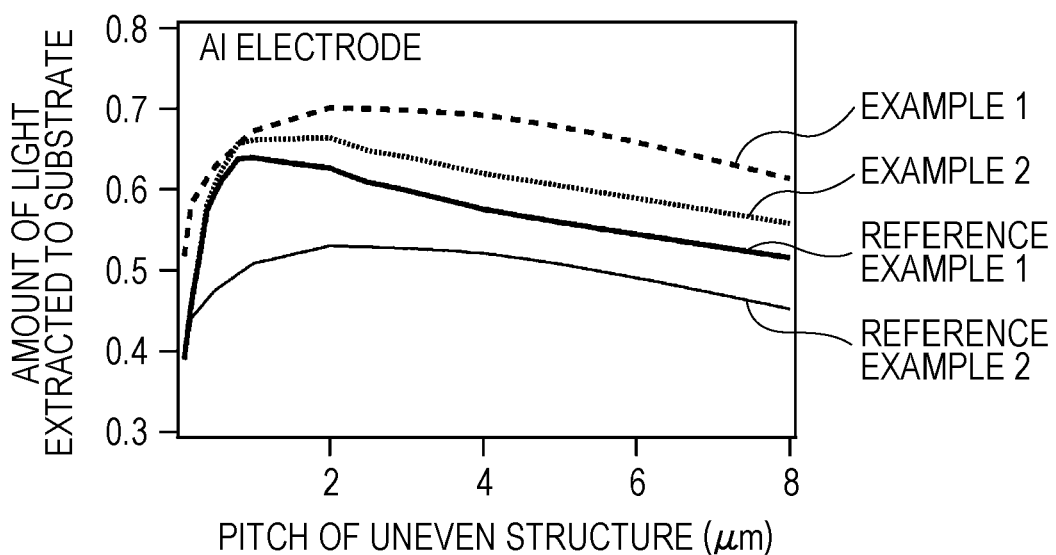
FIG. 15 shows the relationship between the pitch of a first uneven structure and the amount of light extracted through a substrate in light-emitting devices of Examples.

FIG. 15 shows the relationship between the pitch of the first uneven structure and the amount of light extracted to the substrate in the case where the reflecting electrode is made of Al. Note that, for Example 2, both pitches of the first and second uneven structures 50 and 20 are changed so that those pitches are the same. For the Reference Example 1, the pitch of the second uneven structure 120 is changed since the Reference Example 1 does not have a first uneven structure.

It is clear from FIG. 15 that, as in the case where the reflecting electrode is made of Ag, the light-emitting device of Example 1 can emit a larger amount of light than the light-emitting device of Reference Example 1 including only the second uneven structure and the light-emitting device of Reference Example 2 including only the first uneven structure in the entire range of the pitch (0.05 μm to 8 μm) shown in FIG. 15. In particular, the emission amount is larger than the peak emission amount of Reference Example 1 in the range of the pitch of 0.8 μm to 7 μm.

A large emission amount can also be achieved with the light-emitting device of Example 2 in the range of 0.4 μm to 8 μm. In particular, the emission amount is larger than the peak emission amount of Reference Example 1 in the range of the pitch of 0.4 μm (400 nm) to 3 μm.

Figure 16:
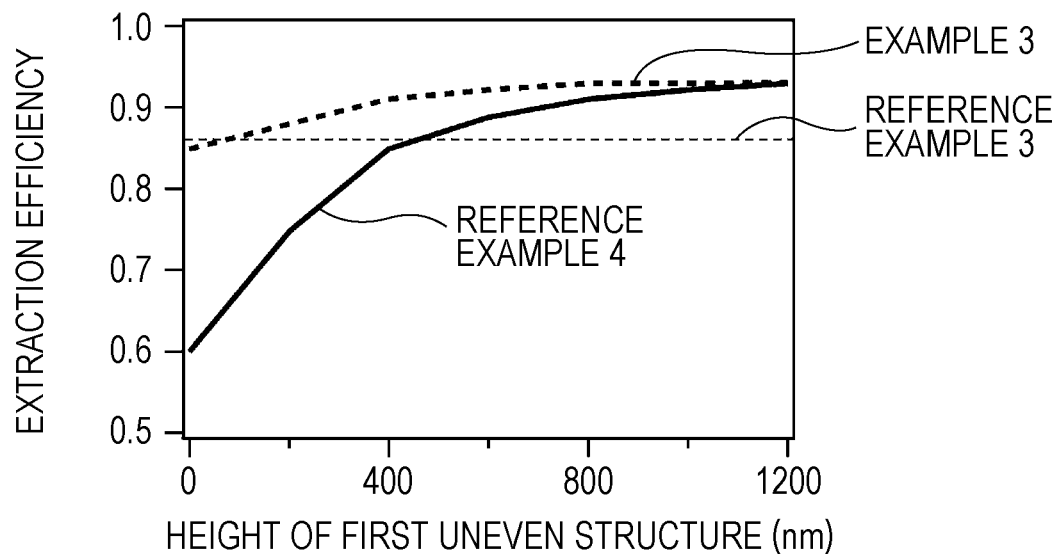
FIG. 16 shows the relationship between the height of a first uneven structure and the extraction efficiency in light-emitting devices of Examples.

FIG. 16 shows the relationship between the height of the first uneven structure and the extraction efficiency. A broken line indicates the extraction efficiency in the light-emitting device of Reference Example 3. The light-emitting device of Reference Example 3 does not include the first uneven structure, and thus the extraction efficiency is constant so as to be parallel to the horizontal axis.

It is clear from FIG. 16 that, when the height of the first uneven structure is 100 nm or more, the light-emitting device of Example 3 achieves a higher extraction efficiency than the light-emitting device of Reference Example 3. In particular, when the height is 400 nm or more, the extraction efficiency is 0.9 or more.

Figure 17:
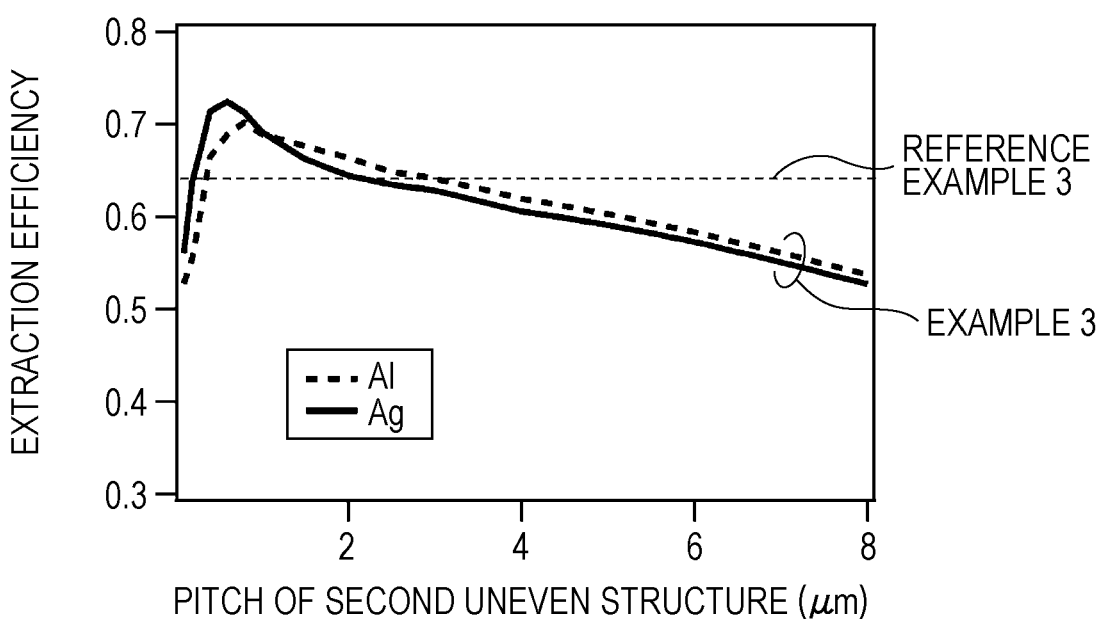
FIG. 17 shows the relationship between the pitch of a second uneven structure and the extraction efficiency in light-emitting devices of Examples.

FIG. 17 shows the relationship between the pitch of the second uneven structure and the extraction efficiency in the case where the reflecting electrode is made of Ag or Al. A broken line indicates the peak extraction efficiency (pitch:

800 nm) of the light-emitting device of Reference Example 3. The pitch of the second uneven structure 20 of Example 3 is changed from 800 nm.

It is clear from FIG. 17 that, when the pitch of the second uneven structure is in the range of 200 nm to 3 μm, the extraction efficiency is higher than the highest extraction efficiency of the light-emitting device of Reference Example 3, regardless of the materials (Ag and Al) for the reflecting electrode.

It is found from the above results that a high light extraction efficiency is achieved when the pitch of the first uneven structure is 800 nm to 6 μm and the height of the first uneven structure is 400 nm or more. It is also found that the influence of the surface plasmon can be effectively suppressed when the pitch of the second uneven structure is 200 nm to 3 μm and the height of the second uneven structure is 20 nm to 100 nm.

It has been found that a high light extraction efficiency is achieved in the light-emitting device of this embodiment by differentiating the shapes of the first uneven structure and the second uneven structure. In particular, FIGS. 9 and 14 suggest that the optimum heights of depressions and projections are different between the second uneven structure that effectively suppresses the influence of the surface plasmon and the first uneven structure that suppresses the total reflection and efficiently extracts light from the light-emitting element. Therefore, a light-emitting device having a high light extraction efficiency on the whole is achieved by appropriately setting the heights of the first uneven structure and the second uneven structure.

Furthermore, the dependence of the diffraction efficiency of light on wavelength is dependent on the pitch. The dependence of the diffraction angle of light on wavelength is also dependent on the pitch. Thus, those dependences can be reduced by differentiating the pitches of the first uneven structure and the second uneven structure. Therefore, the color irregularity of light emitted from the light-emitting device can be suppressed by differentiating the pitches of the first uneven structure and the second uneven structure.

3. Production Method

A method for producing the light-emitting device according to this embodiment will be described with reference to FIGS. 18A to 18D.

Figure 18A:
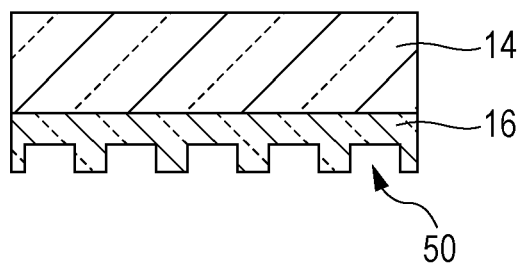
FIGS. 18A to 18D are sectional views illustrating the process in a method for producing the light-emitting device according to the first embodiment.

As illustrated in FIG. 18A, a low-refractive-index layer 16 is formed on a transparent substrate 14, and a first uneven structure 50 is formed on the surface of the low-refractive-index layer 16. The low-refractive-index layer 16 may be a portion of the substrate 14. The first uneven structure 50 may be formed on the surface of the low-refractive-index layer 16 by a semiconductor process including photolithography and etching in a combined manner. Alternatively, the first uneven structure 50 may be formed by cutting or the like. The low-refractive-index layer 16 may be formed of a resin curable by heat or ultraviolet rays. In this case, a nanoimprinting technique can be used. For example, a curable resin is formed on the surface of the substrate 14; a mold for forming a first uneven structure 50 is pressed against the surface of the curable resin; and the curable resin is cured by heat or ultraviolet rays to obtain a low-refractive-index layer 16.

Figure 18B:
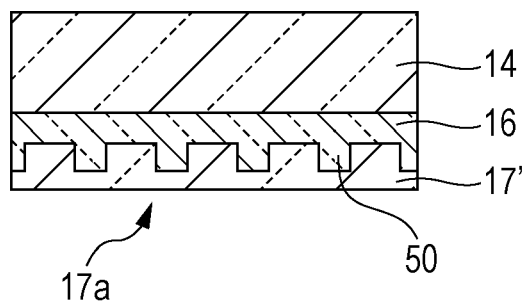

As illustrated in FIG. 18B, the first uneven structure 50 formed on the surface of the low-refractive-index layer 16 is filled with a high-refractive-index material 17'. After the first uneven structure 50 is filled with the high-refractive-index material 17' by a vapor deposition method, a sputtering method or the like, the surface 17a of the high-refractive-index material 17' may be planarized. Alternatively, a resin material may be applied onto the surface of the first uneven structure 50 by coating or spin coating.

Figure 18C:
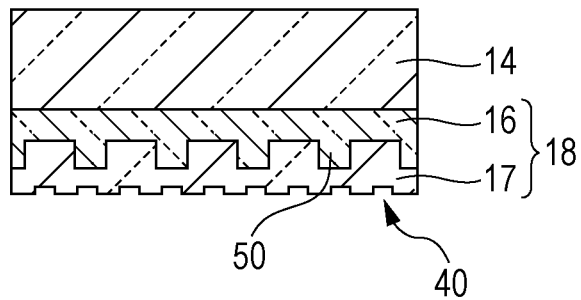

As illustrated in FIG. 18C, an uneven structure 40 having the same pitch and height as those of a second uneven structure 20 is formed on the surface of the high-refractive-index material 17' by a semiconductor process, cutting, nanoimprinting, or the like to form a high-refractive-index layer 17.

Figure 18D:
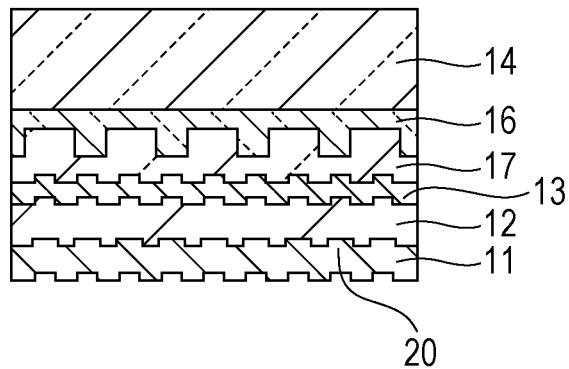

As illustrated in FIG. 18D, a light-emitting element 19 including a transparent electrode 13, an organic layer 12, and a reflecting electrode 11 is formed on the surface of the high-refractive-index layer 17. When the height of the uneven structure 40 is about 100 nm, the shape of the uneven structure 40 can be reflected on the surfaces of the layers of the light-emitting element 19 formed by vapor deposition, coating, or the like. Thus, a second uneven structure 20 is formed at an interface between the organic layer 12 and the reflecting electrode 11. Consequently, the light-emitting device of this embodiment is completed.

Figure 19A:
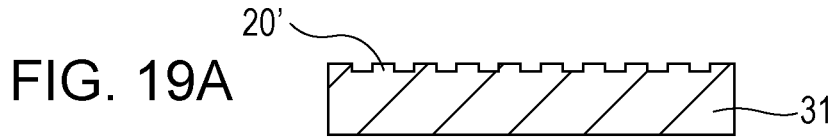
FIGS. 19A to 19E are sectional views illustrating the process in another method for producing the light-emitting device according to the first embodiment.

The light-emitting device of this embodiment can be formed from the side of the reflecting electrode. As illustrated in FIG. 19A, a substrate 31 is prepared, and an uneven structure 20' having the same pitch and height as those of a second uneven structure 20 is formed on the surface of the substrate 31 by a semiconductor process, cutting, nanoimprinting, or the like. Alternatively, a resin layer or an inorganic material layer may be formed on the surface of the substrate 31, and the uneven structure 20' may be formed on the surface of the resin layer or the inorganic material layer.

Figure 19B:
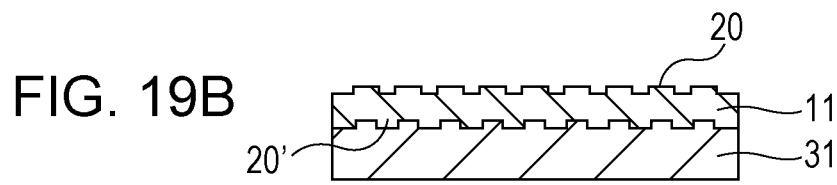

As illustrated in FIG. 19B, a reflecting electrode 11 is formed by a vapor deposition method or a sputtering method, for example. Thus, a reflecting electrode 11 having a surface on which the second uneven structure 20 has been formed as a result of reflection of the shape of the uneven structure 20' can be formed.

Figure 19C:
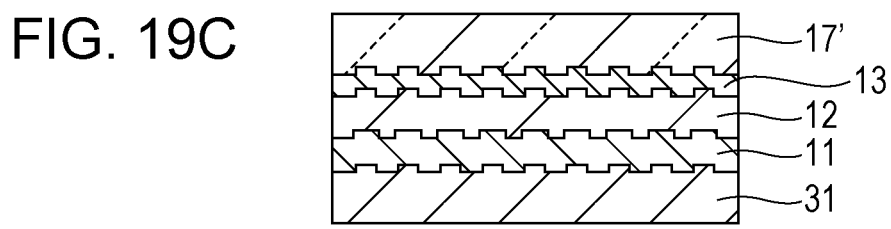
Figure 19D:
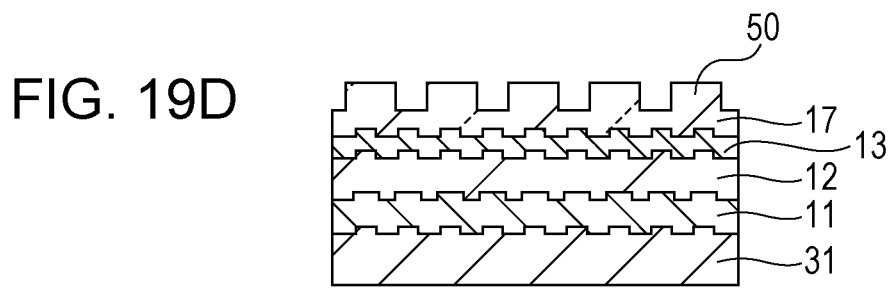

As illustrated in FIG. 19C, an organic layer 12 and a transparent electrode 13 are formed, the surface of the transparent electrode 13 is filled with a high-refractive-index material 17', and the surface of the high-refractive-index material 17' is planarized. As illustrated in FIGS. 19C and 19D, a first uneven structure 50 is formed on the surface of the high-refractive-index material 17'.

Figure 19E:
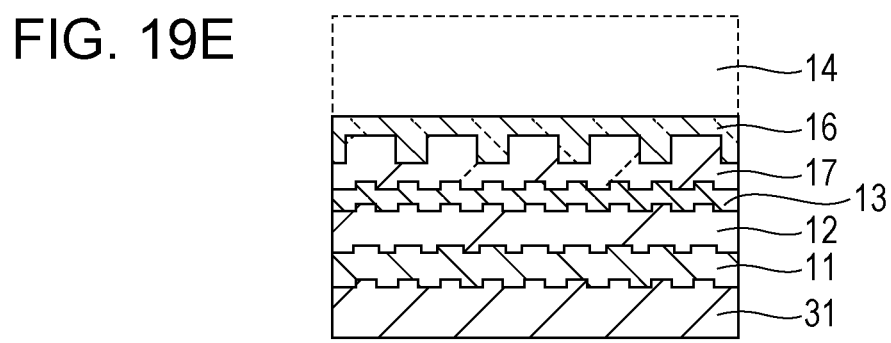

As illustrated in FIG. 19E, the first uneven structure 50 is filled with a low-refractive-index layer 16, and the surface of the low-refractive-index layer 16 is planarized. A substrate 14 may be further formed on the surface of the low-refractive-index layer 16. Consequently, the light-emitting device of this embodiment is completed.

In the case where the first uneven structure and the second uneven structure have the same pitch, the light-emitting device of this embodiment may be produced by the following method.

Figure 20A:
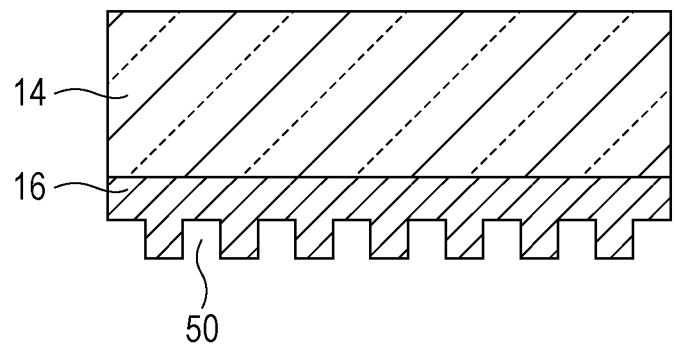
FIGS. 20A and 20B are sectional views illustrating the process in another method for producing the light-emitting device according to the first embodiment.
Figure 20B:
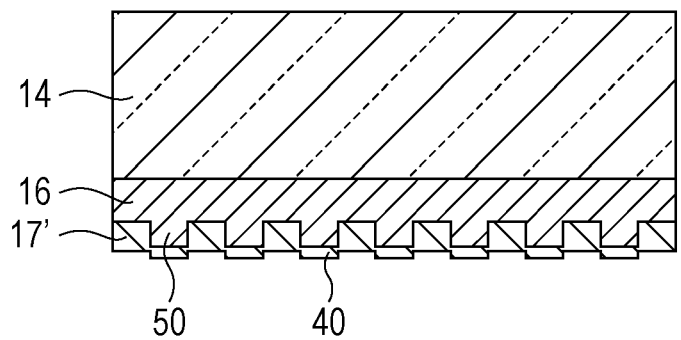

As illustrated in FIG. 20A, a low-refractive-index layer 16 is formed on a transparent substrate 14, and a first uneven structure 50 is formed on the surface of the low-refractive-index layer 16. As illustrated in FIG. 20B, a small amount of a high-refractive-index material 17' is provided in the first uneven structure 50 by a spin coating method or the like. As a result, the first uneven structure 50 is filled with the high-refractive-index material 17', and an uneven structure 40 having a height of projections smaller than that of the first uneven structure 50 is formed. Although the pitch of the uneven structure 40 is the same as the pitch of the first uneven structure 50, the height of the uneven structure 40 is smaller than the height of the first uneven structure 50. By adjusting the amount of the high-refractive-index material 17' so that the height of the uneven structure 40 corresponds to the height of a second uneven structure 20, a second uneven structure 20 can be formed without additionally forming a pattern for defining the second uneven structure 20. In this case, a pattern for defining the first uneven structure 50 is identical with a pattern for defining the second uneven structure 20. A light-emitting element 19 is then formed on the uneven structure 40, and thus a light-emitting device can be produced. According to this method, there is no need to additionally pattern the uneven structure 40 after the patterning of the first uneven structure 50, and thus the production process can be simplified.

Second Embodiment

A light-emitting device according to a second embodiment of the present disclosure will be described below.

Figure 21:
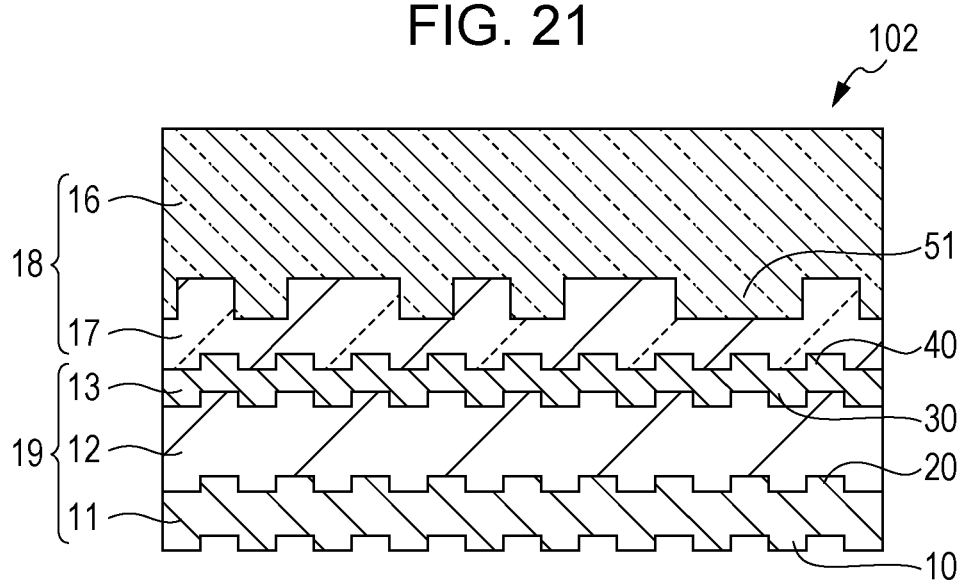
FIG. 21 is a sectional view of a light-emitting device according to a second embodiment.

FIG. 21 is a sectional view schematically illustrating a structure of a light-emitting device 102 of this embodiment. The light-emitting device 102 of this embodiment includes a light-emitting element 19 and a transparent multilayer body 18. The light-emitting element 19 is an organic EL element and includes a transparent electrode 13, a reflecting electrode 11, and an organic layer 12 that includes a light-emitting layer and is sandwiched between the transparent electrode 13 and the reflecting electrode 11. The transparent multilayer body 18 includes a low-refractive-index layer 16 and a high-refractive-index layer 17. A first uneven structure 51 is located at an interface between the low-refractive-index layer 16 and the high-refractive-index layer 17. A second uneven structure 20 is located at an interface between the reflecting electrode 11 and the organic layer 12.

The light-emitting device 102 of this embodiment is different from that of the first embodiment in which the first uneven structure 51 has another uneven shape. The first uneven structure 51 has the uneven shape in which a plurality of depressions and a plurality of projections are two-dimensionally arranged in a random manner. Particularly, the first uneven structure 51 has the uneven shape in which at least two types of unit structures are two-dimensionally arranged in a random manner. Each type of the unit structures have a pattern formed by one or more depressions and one or more projections.

When the first uneven structure and the second uneven structure are periodical structures, the diffraction angle of light to be diffracted shows the wavelength dependence and thus the light emitted from the light-emitting device may result in color irregularity and nonuniform brightness. In particular, this exerts a considerable influence when the light-emitting device emits white light. To overcome such a problem, the first uneven structure 51 has an uneven shape including randomly arranged depressions and projections in this embodiment. Since the light-emitting device includes the first uneven structure 51 and the second uneven structure 20, at least one of these uneven structures may be a random structure. Desirably, the first uneven structure 51 has an uneven shape including randomly arranged depressions and projections as in this embodiment, and the second uneven structure 20 has a periodical structure as described in the first embodiment. Thus, when the light-emitting device is viewed through the substrate 14, the emitted light is uniformly viewed in all directions because of the randomness. In addition, the plasmon is effectively suppressed by the second uneven structure 20.

The term "random structure" means a structure in which a plurality of depressions and a plurality of projections are arranged in a pattern with randomness. The term "pattern with randomness" means any arrangement pattern other than a periodical pattern. For example, the "pattern with randomness" includes not only a completely random pattern in which equal numbers of depressions and projections are randomly arranged, but also a pattern controlled so that more than a predetermined number of projections or depressions are not continuously arranged in an arrangement direction. The number of the plurality of depressions and the number of the plurality of projections are not necessarily equal to each other, and may be different from each other. Each of the plurality of depressions and the plurality of projections typically has the same x-direction size and the same y-direction size, but is not limited to such a structure. These sizes may be differentiated. To simplify the following description, each of the depressions and the projections has the same x-direction size and the same y-direction size. In this specification, the "pattern with randomness" is sometimes abbreviated as a "random pattern".

Figure 22:
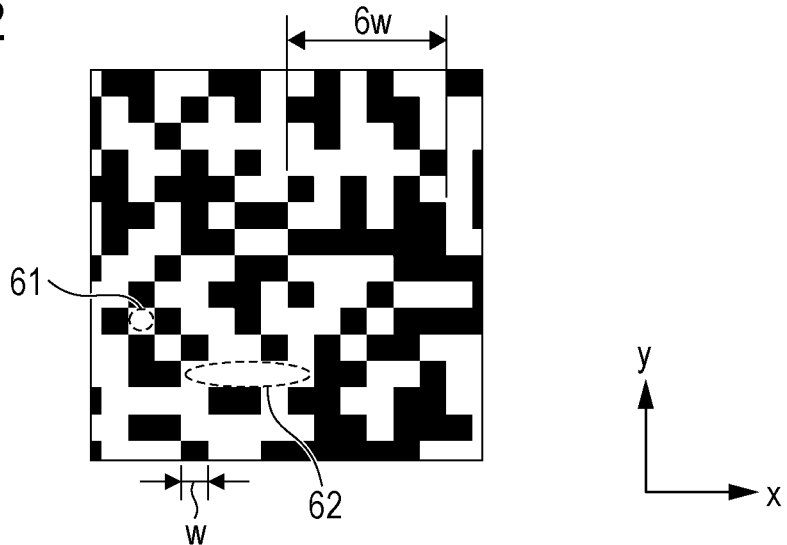
FIG. 22 is a plan view illustrating an example of a random uneven pattern.

The random uneven shape of the first uneven structure 51 will be described in detail. An example of the random uneven structure is a structure disclosed in Japanese Patent No. 4870195. This structure has a grid including "w" squares as a unit area (w is a length of a side of the unit area having a square shape), and a plurality of depressions and a plurality of projections are randomly arranged on the grid. FIG. 22 is a plan view illustrating an example of the uneven pattern. In FIG. 22, for example, white areas are depressions and black areas are projections. (Alternatively, black areas may be depressions and white areas may be projections.)

In the structure illustrated in FIG. 22, the probability that depressions or projections having a width of w are present is ½, and the probability that two continuous depressions or projections having a width of 2 w are present is $(½)^2$. The probability that continuous depressions or projections having a width of nw (n: natural number) are present in each of the x direction and the y direction is generalized to be $(½)^n$. In the random uneven structure, therefore, the average length $w_{exp}$ of the depressions or projections in each of the x direction and the y direction is determined to be 2 w by the following calculation.

$$w_{exp} = w \cdot \left(\frac{1}{2}\right)^1 + 2w \cdot \left(\frac{1}{2}\right)^2 + 3w \cdot \left(\frac{1}{2}\right)^3 + \ldots = \sum_{n=1}^{\infty} nw \cdot \left(\frac{1}{2}\right)^n = 2w$$

The average pitch is the sum of the average size of depressions and the average size of projections, which is 4 w.

As described in the first embodiment, the pitch of the first uneven structure is desirably 800 nm to 6 μm, and the pitch of the second uneven structure is desirably 200 nm to 3 μm. Therefore, when the first uneven structure and the second uneven structure are each a random uneven structure, w in the first uneven structure is desirably 200 nm to 1.5 μm and w in the second uneven structure is desirably 50 nm to 0.75 μm.

In the random structure in which the depressions and projections are arranged with a 50% probability, however, many depressions or projections are continuously arranged with a particular probability and thus continuous depressions or projections having a length of more than 3 μm may be partly formed. For example, a portion indicated by an arrow in FIG. 22 has a length of 6 w in the x direction. Thus, an uneven structure in which the randomness is controlled so that such a large structure is not included may be employed.

Figure 23A:
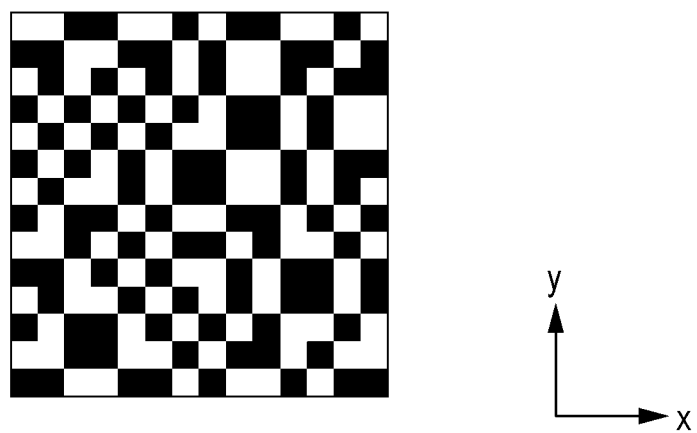
FIG. 23A is a plan view illustrating an example of an uneven pattern in which the amount of low frequency components is reduced.
Figure 23B:
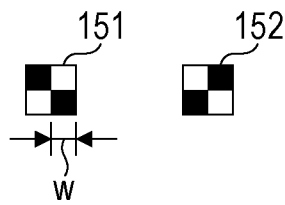
FIG. 23B illustrates two types of unit structures in the uneven structure illustrated in FIG. 23A.

FIG. 23A is a plan view illustrating an example of an uneven structure not including a large structure. In the uneven structure illustrated in FIG. 23A, two types of unit structures 151 and 152 illustrated in FIG. 23B are randomly arranged. The unit structures 151 and 152 include two depressions and two projections that are diagonally arranged. The depressions and projections are reversed between the unit structures 151 and the unit structures 152. By randomly arranging such two types of unit structures without leaving spaces, the randomness can be suppressed compared with the structure in FIG. 22 in which the depressions and projections are randomly arranged. When such an uneven structure is employed, three or more depressions or projections are not continuously arranged in each of the arrangement directions (x direction and y direction). That is, assuming that the minimum diameter of circles 61 or the minimum length of the minor axes of ellipses 62 which are inscribed in the plurality of depressions and the plurality of projections is w in the uneven structure illustrated in FIG. 23A, structures (pitch components) with more than 2 w are not formed. Therefore, when such an uneven structure is employed as the first uneven structure, the total reflection loss can be suppressed. When such an uneven structure is employed as the second uneven structure, the surface plasmon can be effectively suppressed.

Figure 24A:
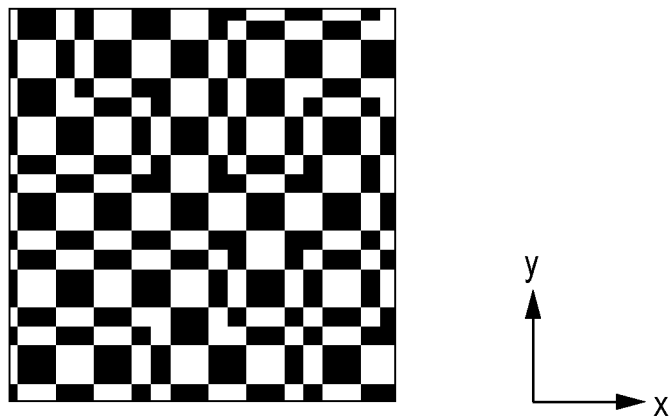
FIG. 24A is a plan view illustrating another example of an uneven structure in which the amount of low frequency components is reduced.
Figure 24B:
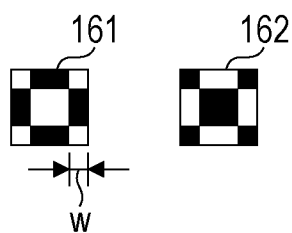
FIG. 24B illustrates two types of unit structures in the uneven structure illustrated in FIG. 24A.

FIG. 24A is a plan view illustrating another example of an uneven structure not including a large structure. In this uneven structure, two types of unit structures 161 and 162 illustrated in FIG. 24B are randomly arranged. Even when such an uneven structure is employed, structures with more than 2 w are not formed in each of the x direction and the y direction. Therefore, when such an uneven structure is employed as the first uneven structure, the total reflection loss can be suppressed. When such an uneven structure is employed as the second uneven structure, the surface plasmon can be effectively suppressed.

In the structures illustrated in FIGS. 23A and 24A, the lengths in the x direction and the y direction are only w or 2 w. Thus, it can be considered that the amount of large pitch components (i.e., low frequency components) is reduced. The randomness of these random patterns can be analyzed through the Fourier transform of the patterns. The term "Fourier transform of patterns" means a Fourier transform conducted when the heights of flat portions of depressions and projections relative to the reference level are expressed as a two-dimensional function for the coordinates x and y.

Figure 25:
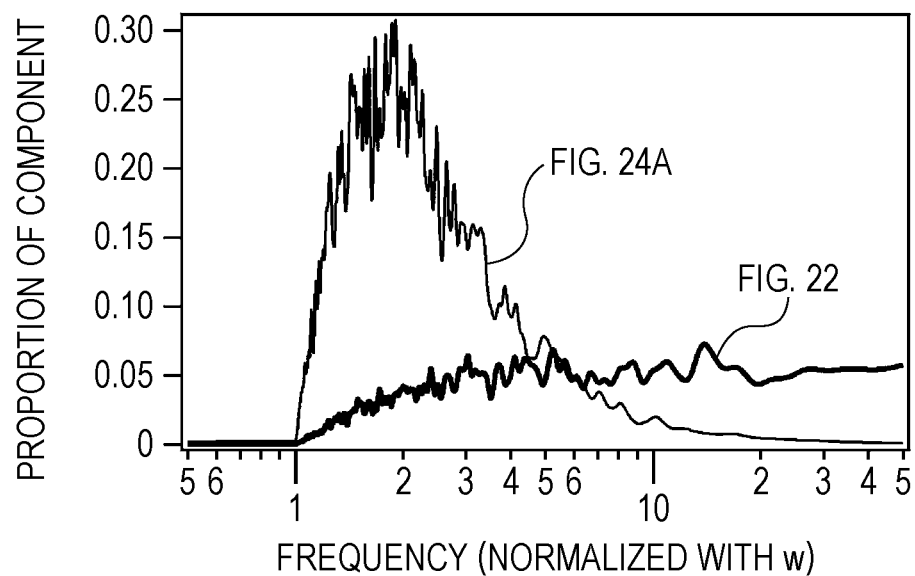
FIG. 25 shows the results of analysis about pitch components of random patterns, the analysis being performed by Fourier transforming uneven patterns.

FIG. 25 shows the results of analysis of pitch components of the random patterns, the analysis being performed by Fourier transforming the uneven patterns. FIG. 25 shows the proportion of pitch components (the inverse of spatial frequency components) in the x direction. Herein, the random pattern illustrated in FIG. 22 and the controlled random pattern illustrated in FIG. 24A are compared with each other. It is found that the pattern in FIG. 24A has a peak at a pitch component with 2 w and the amount of pitch components with more than 2 w is reduced compared with the pattern in FIG. 22. Therefore, the pattern in FIG. 24A is considered to have a structure mainly including pitch components with 2 w.

Figure 26:
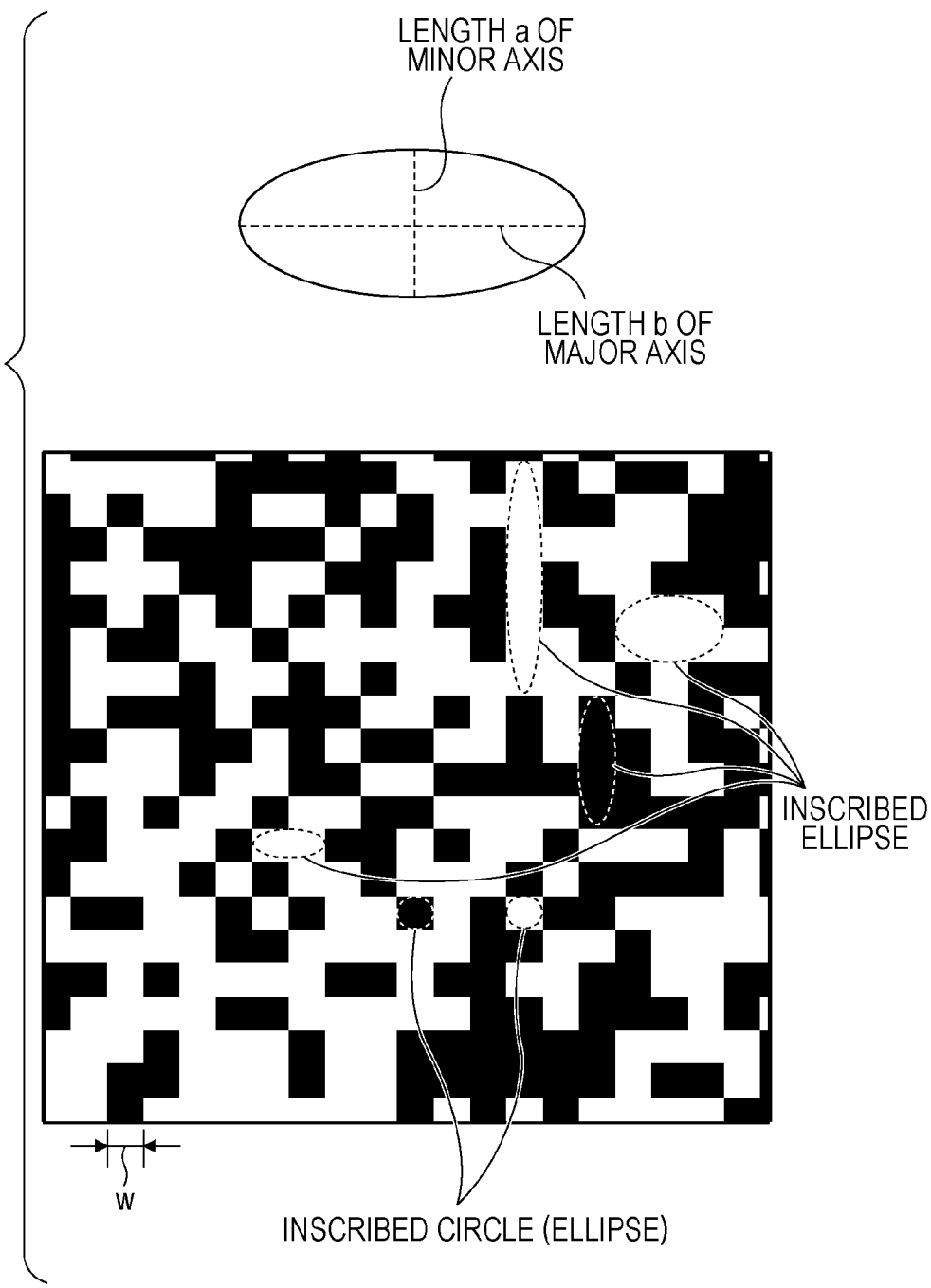
FIG. 26 is a diagram for describing a method for determining an average pitch from a structure pattern.

Also in the structure illustrated in FIG. 23A or 24A in which the amount of low frequency components is reduced, the average pitch can be determined in the same manner as in the structure in FIG. 22. FIG. 26 illustrates a method for determining the average pitch from the structure pattern. Herein, ellipses (including perfect circles) which are inscribed in areas selected from the group of the same types of continuous structures are assumed for each of the vertical direction and the horizontal direction in FIG. 26. The average of the sizes of white portions in the lower drawing of FIG. 26 can be determined by calculating the average of the lengths of the axes of ellipses which are inscribed in the white portions. The term "length of an axis" indicates either the length a of a minor axis or the length b of a major axis illustrated in the upper drawing of FIG. 26. The same applies to black portions. The average pitch may be the sum of the average of the sizes of the white portions and the average of the sizes of the black portions.

Therefore, when the first uneven structure and the second uneven structure have an uneven shape in which depressions and projections are arranged with such randomness, w in the random structure is desirably in the range of 400 nm to 3 µm for the first uneven structure and 100 nm to 1.5 µm for the second uneven structure.

In the above example, there is an assumption that the sectional shape obtained by imaginarily cutting the space of the depressions and projections along a plane parallel to the interface is a square, but the sectional shape may be another shape such as a hexagon. According to the studies conducted by the present inventors, the light extraction efficiency is higher in a structure having a regular hexagonal sectional shape than in a structure having a square sectional shape. This is because the length of a diagonal line is √2 times the length of a side in the square whereas the length of a diagonal line is √3/2 times the length of a side in the regular hexagon. Thus the direction dependence is low in the structure having a regular hexagonal sectional shape. In other words, in the case of the structure having a square sectional shape, the extraction efficiency decreases in either of a side direction or a diagonal direction. However, in the case of the structure having a regular hexagonal sectional shape, a high extraction efficiency is achieved regardless of the directions.

Figure 27A:
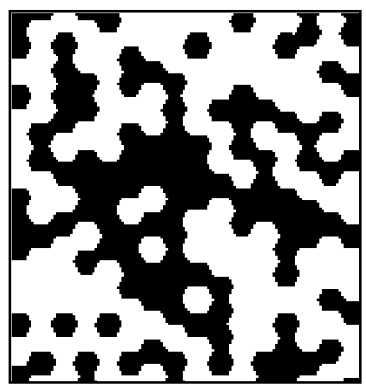
FIG. 27A illustrates an example of a random structure in which the basic shape is a regular hexagon.
Figure 27B:
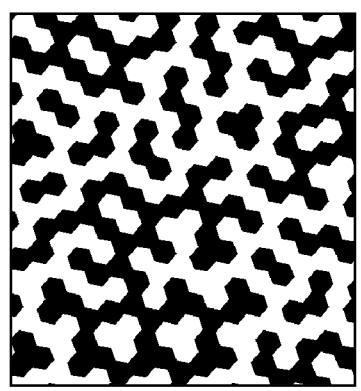
FIG. 27B illustrates an example of a random pattern in which the formation of large structures is suppressed by controlling the randomness.

FIG. 27A illustrates an example of a random structure (both the existence probabilities of depressions and projections are ½) in which the basic shape is changed from the square to the regular hexagon. FIG. 27B illustrates an example of a random pattern in which the randomness is controlled to suppress the generation of large structures as in the case of the pattern in FIG. 23A or 24A. In the random pattern illustrated in FIG. 27B, the randomness is controlled so that at most three regular hexagons are arranged in the arrangement directions (three directions perpendicular to the three sides). That is, the size of the same type of structure in an arrangement direction is in the range of w to 3 w. If such a pattern is Fourier transformed, the peak is present at a pitch component with 2 w and the amount of large pitch components with more than 2 w (low frequency components) is reduced.

The randomness or the periodicity of the uneven pattern can be judged by Fourier transforming the pattern as described above. Hereafter, a method for judging the dominance of randomness or periodicity by Fourier transform will be described.

Figure 28:
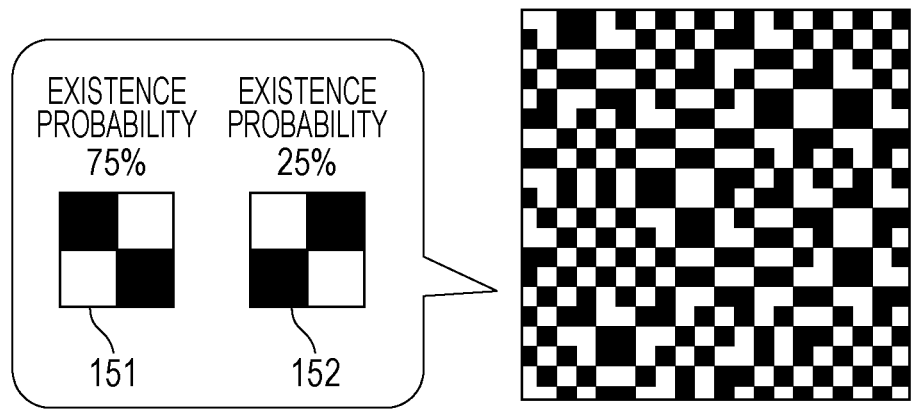
FIG. 28 is a plan view illustrating an example of an uneven structure in which the existence probabilities of the first unit structures and the second unit structures in the structure illustrated in FIG. 23A are changed to 75% and 25%, respectively.
Figure 29:
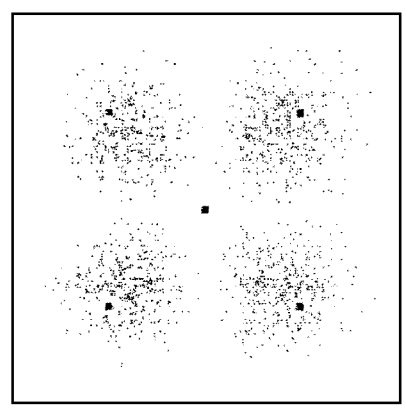
FIG. 29 illustrates the amplitude of spatial frequency components obtained by Fourier transforming the uneven pattern in FIG. 28.

FIG. 28 is a plan view illustrating an example of an uneven structure in which the existence probabilities of the first unit structures 151 and the second unit structures 152 in the structure illustrated in FIG. 23A are changed to 75% and 25%, respectively. FIG. 29 illustrates the amplitude of spatial frequency components obtained by Fourier transforming the uneven pattern in FIG. 28. This uneven structure includes both random components and periodical components which result from the periodical existence of the first unit structures 151 having a high existence probability. The periodical components correspond to four points located in four oblique directions from the center in FIG. 29. The random components correspond to a plurality of points distributed around the four points.

FIGS. 30A to 30E show five uneven patterns having different proportions of periodical components and the results obtained by Fourier transforming the patterns. In FIGS. 30A to 30E, the right side shows the uneven pattern and the left side shows a one-dimensional distribution of the amplitude of periodical components in one arrangement direction of the uneven pattern. FIGS. 30A to 30E show the cases where the proportions of the periodical components are 100%, 60%, 40%, 20%, and 0%, respectively. In the uneven patterns, the proportions of the periodical components are different from each other because the existence probability of the first unit structures 151 is different from that of the second unit structures 152.

Herein, it is assumed that the existence probability of the first unit structures 151 is x % and the existence probability of the second unit structures 152 is y %, where x>y and x+y=100. The first unit structures 151 corresponding to y % of the total can be considered to be random components because of the presence of pairs with the second unit structures 152. On the other hand, the first unit structures 151 corresponding to (x−y) % of the total can be considered to be periodical components because of the absence of pairs with the second unit structures 152. That is, when the existence probability of the first unit structures 151 is assumed to be x % and the existence probability of the second unit structures 152 is assumed to be y %, the first unit structures 151 corresponding to y % of the total are random components and the first unit structures 151 corresponding to (x−y) % of the total are periodical components.

In the pattern of FIG. 30A, the ratio of the number of the first unit structures 151 to the number of the second unit structures 152 is 100:0, and thus the proportion of the periodical components is 100%. In the pattern of FIG. 30B, the ratio is 80:20, and thus the proportion of the periodical components is 60%. In the pattern of FIG. 30C, the ratio is 70:30, and thus the proportion of the periodical components is 40%. In the pattern of FIG. 30D, the ratio is 65:45, and thus the proportion of the periodical components is 20%. In the pattern of FIG. 30E, the ratio is 50:50, and thus the proportion of the periodical components is 0%. In the uneven patterns illustrated in FIGS. 30B to 30D, it is found from the results of Fourier transform that the periodical components and the random components coexist.

By analyzing the periodical components (spatial frequency components) of the random pattern, the dominance of random components or periodical components can be judged. For example, when the amplitude of frequency components derived from randomness is larger than that of frequency components derived from periodicity in a certain pattern, the random components can be considered to be dominant in the pattern. Therefore, the uneven structure of this embodiment has a random pattern in which random components are dominant.

Third Embodiment

A light-emitting device of a third embodiment will be described below. The light-emitting device of this embodiment is different from those of the first and second embodiments in that the light-emitting device has a structure corresponding to the second uneven structure, but does not have a structure corresponding to the first uneven structure. Hereafter, points different from those of the first and second embodiments will be described.

In the structure disclosed in Patent Document 1, a diffraction grating having periodical protrusions is used. Therefore, the structure shows a large wavelength dependence and the brightness and color vary depending on the angle at which the device is viewed. That is, such a structure poses problems such as nonuniform brightness and color irregularity. In particular, color irregularity is a critical defect in organic EL elements that emit white light.

This embodiment relates to a light-emitting device in which color irregularity and nonuniform brightness are suppressed while the emission efficiency is improved by suppressing the influence of a surface plasmon. In this embodiment, an uneven structure having a random pattern is used to reduce the wavelength dependence.

Figure 31:
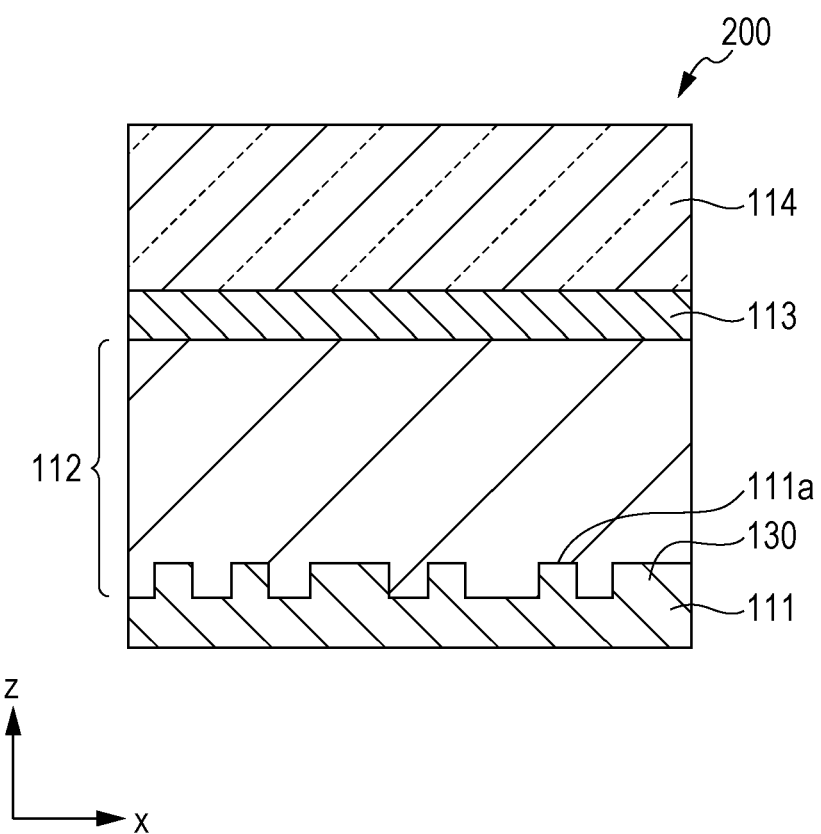
FIG. 31 is a sectional view schematically illustrating a structure of a light-emitting device according to a third embodiment.

FIG. 31 is a sectional view schematically illustrating a structure of a light-emitting device (organic EL element) 200 of this embodiment. The light-emitting device 200 has a structure in which a transparent substrate 114, a transparent electrode 113, an organic layer 112, and a reflecting electrode 111 are stacked in that order as in the structure illustrated in FIG. 3. An uneven structure 130 in which a plurality of depressions and a plurality of projections are two-dimensionally arranged in a random pattern is formed at an interface 111a between the organic layer 112 and the reflecting electrode 111. In FIG. 31, the arrangement directions of the plurality of depressions and the plurality of projections are an x direction and a y direction, and a direction perpendicular to the arrangement directions is a z direction. The uneven structure 130 is a structure corresponding to the second uneven structure described above. The two-dimensional arrangement pattern of the uneven structure 130 may be, for example, the pattern illustrated in FIG. 23A, 24A, or 27B.

The patterns of the above uneven structures are merely examples, and the pattern of the uneven structure is not limited thereto. A structure in which the amount of large pitch components is reduced by a method other than the method in which unit structures are arranged as illustrated in FIG. 23B or 24B may be employed. In the case where it is difficult to form the uneven structure 130 by directly processing the interface between the organic layer 112 and the reflecting electrode 111, the uneven structure 130 may be formed in the end by forming a structure having a shape corresponding to that of the uneven structure 130 on a surface of another layer. By forming a structure having a shape corresponding to that of the uneven structure 130 on a surface of another layer, layers of the organic layer 112 can be deposited so as to each have the shape. Thus, the uneven structure 130 can be formed at the interface between the organic layer 112 and the reflecting electrode 111.

Figure 32A:
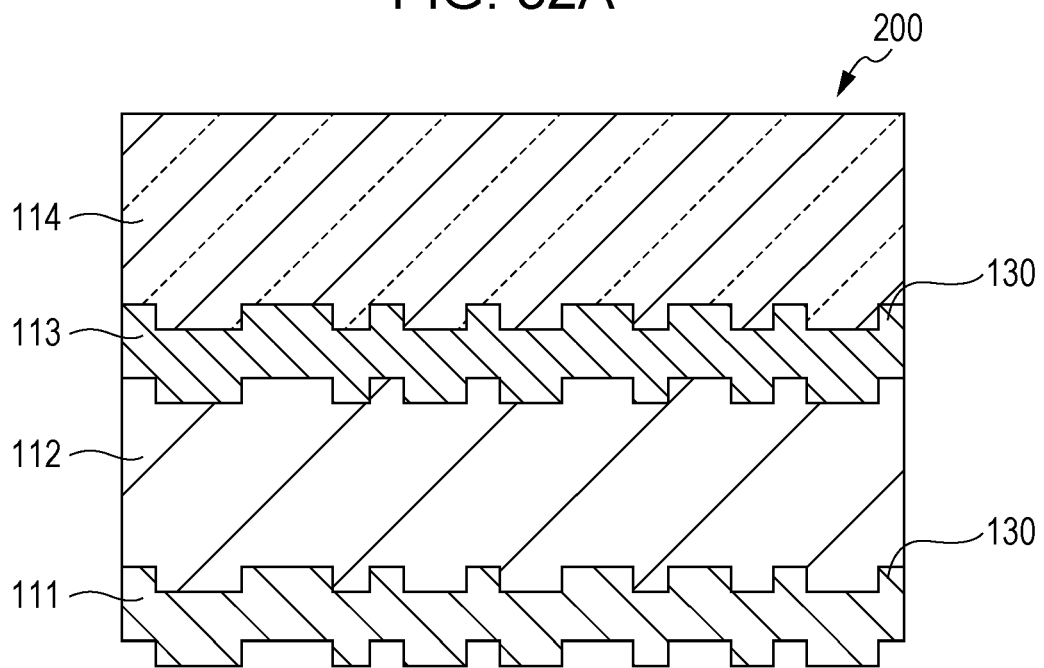
FIG. 32A illustrates an example of an organic EL element in which an uneven structure is further formed on another layer in the third embodiment.
Figure 32B:
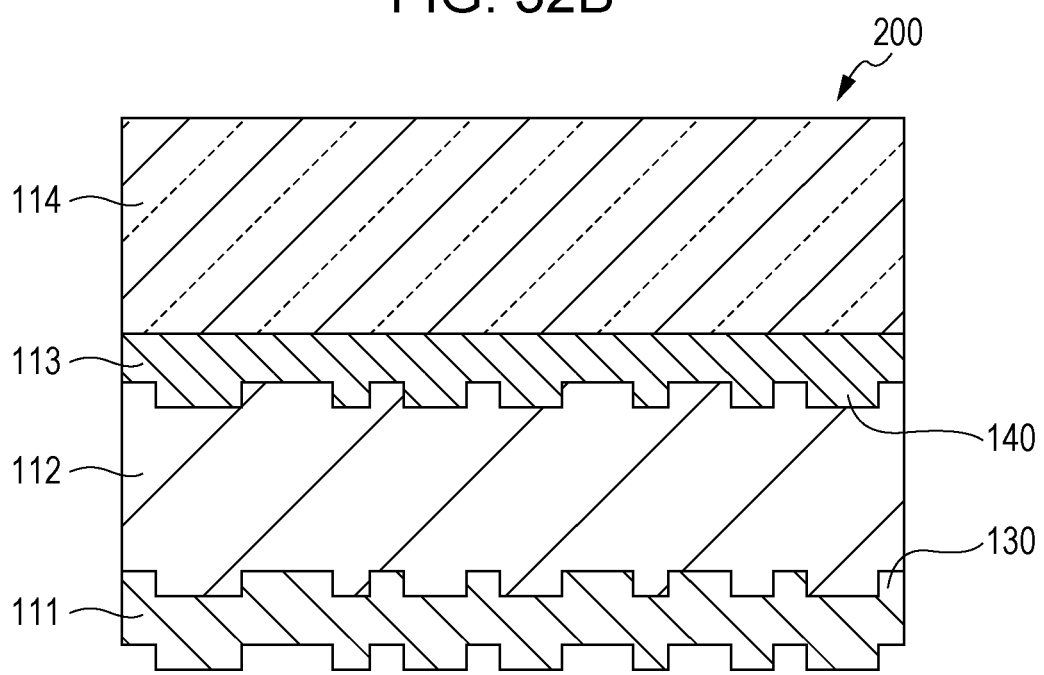
FIG. 32B illustrates another example of an organic EL element in which an uneven structure is further formed on another layer in the third embodiment.

FIGS. 32A and 32B each illustrate an example of an organic EL element in which an uneven structure is formed in other layers. As illustrated in FIG. 32A, the uneven structure 130 may be formed at the interface between the organic layer 112 and the reflecting electrode 111 by forming the same structure as the uneven structure 130 at an interface between the transparent substrate 114 and the transparent electrode 113. Alternatively, as illustrated in FIG. 32B, the uneven structure 130 may be formed by forming an uneven structure 140 corresponding to the uneven structure 130 at the interface between the transparent electrode 113 and the organic layer 112.

Figure 33A:
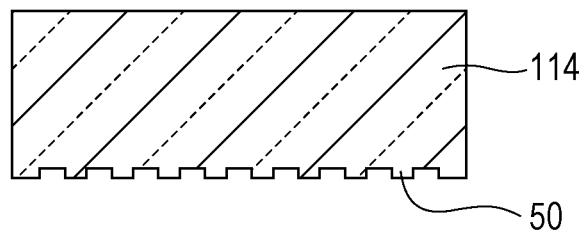
FIGS. 33A to 33C illustrate an example of a method for producing a light-emitting device including an uneven structure.

Hereafter, an example of a method for producing a light-emitting device including the uneven structure 130 will be described with reference to FIGS. 33A to 33C. As illustrated in FIG. 33A, an uneven structure 50 having a shape corresponding to that of an uneven structure 130 is formed on a surface of a transparent substrate 114. The uneven structure 50 may be formed by any method such as a semiconductor process, cutting, or nanoimprinting.

Figure 33B:
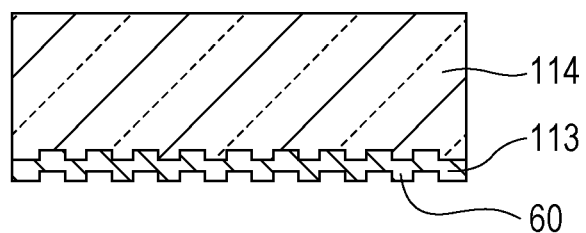

As illustrated in FIG. 33B, a transparent electrode 113 is then formed on the surface of the transparent substrate 114. The transparent electrode 113 can be formed by a method such as vapor deposition or coating. When the height of the uneven structure 50 is about 100 nm, the shape of the uneven structure 50 can be reflected on the surface of the formed transparent electrode 113. Thus, an uneven structure 60 is formed on the surface of the transparent electrode 113.

Figure 33C:
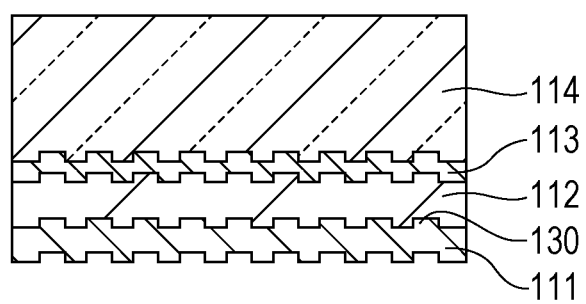

As illustrated in FIG. 33C, an organic layer 112 is then formed, and a reflecting electrode 111 is further formed. Also in these processes, when the layers are formed by vapor deposition, coating, or the like, the shape of the uneven structure 60 can be reflected on the surfaces of the formed layers. Thus, the uneven structure 130 can be formed at the interface between the organic layer 112 and the reflecting electrode 111. Consequently, a light-emitting device is completed.

The light-emitting device can be formed from the side of the reflecting electrode 111. FIGS. 34A to 34C illustrate such a method. As illustrated in FIG. 34A, a substrate 31 is prepared, and an uneven structure 130' having the same pitch and height as those of an uneven structure 130 is formed on the surface of the substrate 31 by a semiconductor process, cutting, nanoimprinting, or the like. Alternatively, a resin layer or an inorganic material layer may be formed on the surface of the substrate 31, and the uneven structure 130' may be formed on the surface of the resin layer or the inorganic material layer.

As illustrated in FIG. 34B, a reflecting electrode 111 is then formed by a vapor deposition method or a sputtering method, for example. Thus, a reflecting electrode 111 having a surface on which an uneven structure 130 has been formed as a result of reflection of the shape of the uneven structure 130' can be formed.

As illustrated in FIG. 34C, an organic layer 112 and a transparent electrode 113 are then formed, the surface of the transparent electrode 113 is filled with a transparent material, and the surface of the transparent material is planarized to form a transparent substrate 114. Thus, a light-emitting device is completed.

The transparent substrate 114 is not an essential component. The light that has reached the transparent substrate 114 may be directly extracted to the outside of the light-emitting device through the surface of the transparent substrate 114. Alternatively, the light may be extracted to the outside of the light-emitting device using a light extraction film, such as a microlens array or a layer composed of a plurality of diffusing particles. Such a light extraction film is located on the surface of the transparent substrate 114. The method for producing a light-emitting device is not limited to the above method, and any method may be employed.

As described above, the influence of a surface plasmon can be suppressed and the light extraction efficiency can be improved by disposing a random uneven structure between the organic layer and the reflecting electrode. Hereafter, an organic EL element having such an uneven structure will be more specifically described.

Figure 35:
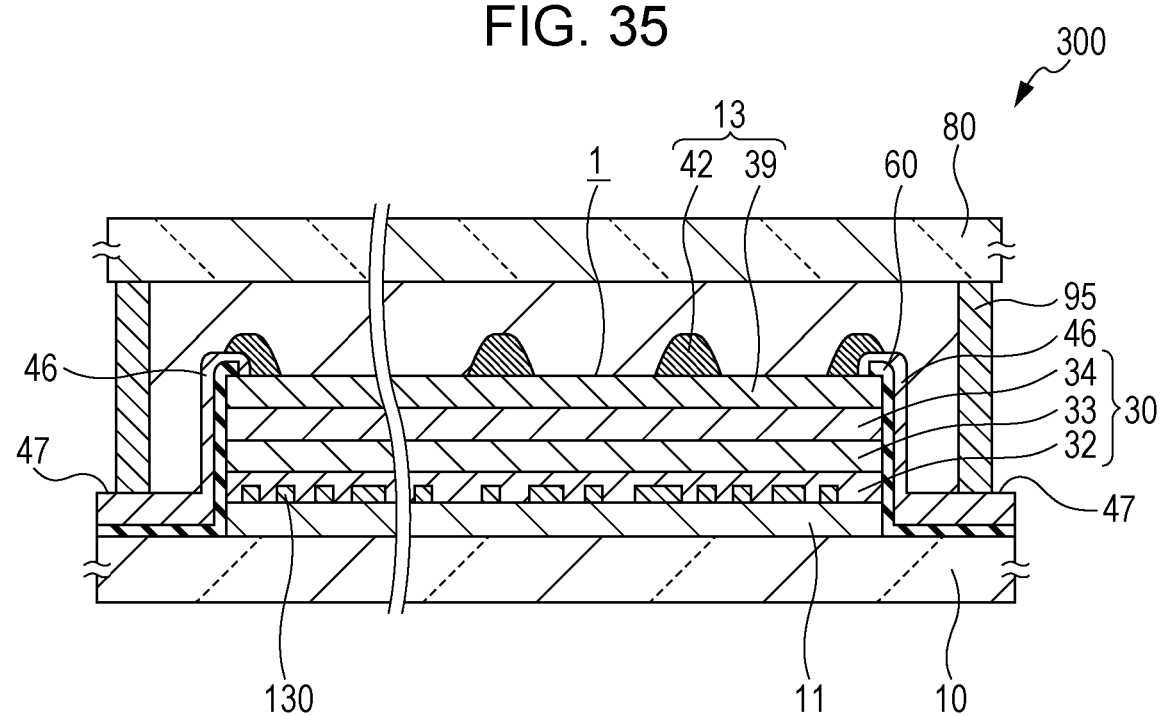
FIG. 35 is a sectional view illustrating a structure of an organic EL element according to the third embodiment.

FIG. 35 is a sectional view illustrating a structure of an organic EL element 300 of this embodiment. The organic EL element 300 includes a substrate 10, a reflecting electrode 11 located on one surface (hereafter may be referred to as an "electrode-side surface") of the substrate 10, a transparent electrode 13 located on the side remote from the substrate 10 so as to face the reflecting electrode 11, and an organic layer 30 that is sandwiched between the reflecting electrode 11 and the transparent electrode 13 and includes a light-emitting layer 32. An uneven structure 130 with randomness is formed on a surface (an interface between the reflecting electrode 11 and the organic layer 30) of the reflecting electrode 11 on the transparent electrode 13 side. The multilayer structure including the reflecting electrode 11, the organic layer 30, and the transparent electrode 13 constitutes an element unit 1. The organic EL element 300 of this embodiment is a top emission-type organic EL element in which light is extracted through the transparent electrode 13.

The transparent electrode 13 includes a polymer conductive layer (herein after called as "conductive layer") 39 that is in contact with the organic layer 30 and has a light transmission property. Thus, light can be extracted through the transparent electrode 13 in the organic EL element 300. In addition to the conductive layer 39, the transparent electrode 13 may include an electrode pattern 42 located on the conductive layer 39 on the side remote from the organic layer 30. As illustrated in a plan view of FIG. 36, the electrode pattern 42 includes an electrode portion 44 that covers a surface of the conductive layer 39 on the side remote from the organic layer 30 and a plurality of openings 41 for extracting light from the organic layer 30 to the outside, the openings 41 being surrounded by the electrode portion 44. The plurality of openings 41 are provided so that the surface of the conductive layer 39 on the side remote from the organic layer 30 is exposed. Thus, light can be extracted through the transparent electrode 13 in the organic EL element 300. In the case where the voltage drop due to the resistance of the conductive layer 39 is negligible, the transparent electrode 13 may be composed of only the conductive layer 39. The case where the voltage drop due to the resistance of the conductive layer 39 is negligible is, for example, a case where the in-plane uniformity of the brightness of the organic EL element 300 satisfies the required specification. The conductive layer 39 can be formed of, for example, a conductive polymer or ITO.

The organic EL element 300 further includes a sealing substrate 80 that has a light transmission property and is located on the light-emitting side opposite from the substrate 10 and a rectangular frame-shaped unit 95 interposed between the periphery of the substrate 10 and the periphery of the sealing substrate 80.

In the organic EL element 300, a portion (not illustrated) of the reflecting electrode 11 on which a multilayer film including the organic layer 30 and the transparent electrode 13 is not formed may be treated as a terminal portion. Alternatively, a terminal portion may be connected to the reflecting electrode 11 through a lead line. Further alternatively, the substrate 10 may be formed of a metal plate or a metal foil and the exposed portion of the substrate 10 may be treated as a terminal portion. Hereafter, the terminal portion on the reflecting electrode 11 side may be referred to as a "first terminal portion" and the lead line may be referred to as a "first lead line".

The organic EL element 300 includes a second terminal portion 47 electrically connected to the transparent electrode 13 through a second lead line 46. The organic EL element 300 also includes an insulating layer 60 formed so as to cover the electrode-side surface of the substrate 10, the side surface of the reflecting electrode 11, the side surface of the organic layer 30, and the peripheral surface of the transparent electrode 13. The insulating layer 60 electrically insulates the second lead line 46 from the organic layer 30 and the reflecting electrode 11. In the structure of FIG. 35, the second lead line 46 and the second terminal portion 47 are located on the electrode-side surface of the substrate 10, but the organic EL element 300 is not limited to such a structure. For example, when the substrate 10 is formed of a metal foil, the second terminal portion 47 may be folded back to the side remote from the sealing substrate 80 together with portions of the insulating layer 60 and the substrate 10.

Hereafter, each component of the organic EL element 300 will be described in detail.

The planar shape of the substrate 10 is a rectangle, but is not limited thereto. The planar shape of the substrate 10 may be, for example, a circle or a polygon other than a rectangle.

In this embodiment, the substrate 10 is a rigid glass substrate, but is not limited thereto. The substrate 10 may be, for example, a rigid or flexible plastic plate, a rigid metal plate, or a flexible metal foil. The glass substrate may be made of, for example, soda-lime glass or alkali-free glass. The plastic plate may be made of polyethylene terephthalate, polyethylene naphthalate, polyether sulfone, or polycarbonate. The metal plate or the metal foil may be made of, for example, a metal such as copper, stainless steel, aluminum, nickel, tin, lead, gold, silver, iron, or titanium or an alloy containing at least one of the foregoing metals. When the plastic plate is used, a plastic plate on which an SiON film, an SiN film, or the like is formed may be used to suppress the penetration of moisture. As described above, the substrate 10 may be rigid or flexible. Furthermore, the substrate 10 is not limited to a transparent glass substrate, a transparent plastic plate, a metal plate, or a metal foil, and may be made of any material that is available at low cost and has high mechanical strength, a gas barrier property, chemical resistance, heat resistance, and the like. When a conductive material such as a metal plate or a metal foil is used for the substrate 10, the substrate 10 may constitute part of the reflecting electrode 11 or may also serve as the reflecting electrode 11.

When the glass substrate is used as the substrate 10, depressions and projections on the electrode-side surface of the substrate 10 may induce a leakage current of the organic EL element 300, which results in the degradation of the organic EL element 300. Therefore, when a glass substrate is used as the substrate 10, a glass substrate for forming an element may be used, the glass substrate being precisely polished so that the surface roughness of the electrode-side surface of the substrate 10 decreases. Regarding the surface roughness of the electrode-side surface of the substrate 10, the arithmetical mean roughness Ra specified in JIS B 0601-2013 (ISO 4287-1997) is desirably 10 nm or less and more desirably several nanometers or less. On the other hand, when a plastic plate is used as the substrate 10, a plastic plate having an arithmetical mean roughness Ra of the electrode-side surface of several nanometers or less is available at low cost without being precisely polished.

In the organic EL element 300 of this embodiment, the reflecting electrode 11 serves as a cathode and the transparent electrode 13 serves as an anode. In this case, carriers injected into the organic layer 30 from the reflecting electrode 11 are electrons, and carriers injected into the organic layer 30 from the transparent electrode 13 are holes. The reflecting electrode 11 may serve as an anode and the transparent electrode 13 may serve as a cathode.

The organic layer 30 includes a light-emitting layer 32, a hole transport layer 33, and a hole injection layer 34 in that order from the reflecting electrode 11 side. If the reflecting electrode 11 serves as an anode and the transparent electrode 13 serves as a cathode, an electron transport layer may be located instead of the hole transport layer 33 and an electron injection layer may be located instead of the hole injection layer 34.

The structure of the organic layer 30 is not limited to the structure illustrated in FIG. 35. For example, an electron injection layer and an electron transport layer may be located between the reflecting electrode 11 and the light-emitting layer 32, or an interlayer may be located between the light-emitting layer 32 and the hole transport layer 33. If the reflecting electrode 11 serves as an anode and the transparent electrode 13 serves as a cathode, a hole injection layer and a hole transport layer may be located between the reflecting electrode 11 and the light-emitting layer 32.

It is sufficient that the organic layer 30 contains at least the light-emitting layer 32. In other words, the organic layer 30 may be constituted by only the light-emitting layer 32. Layers other than the light-emitting layer 32, such as the electron injection layer, the electron transport layer, the interlayer, the hole transport layer 33, and the hole injection layer 34, may be suitably provided. The light-emitting layer 32 may have a single-layer structure or a multilayer structure. For example, when a desired emission color is white, three types of dopant dyes of red, green, and blue may be doped into the light-emitting layer 32. The light-emitting layer 32 may also have a multilayer structure including a hole-transporting blue light-emitting layer, an electron-transporting green light-emitting layer, and an electron-transporting red light-emitting layer or a multilayer structure including an electron-transporting blue light-emitting layer, an electron-transporting green light-emitting layer, and an electron-transporting red light-emitting layer.

Examples of the material for the light-emitting layer 32 include polyparaphenylenevinylene derivatives, polythiophene derivatives, polyparaphenylene derivatives, polysilane derivatives, polyacetylene derivatives, polyfluorene derivatives, polyvinylcarbazole derivatives, coloring matter, and metal complex-based light-emitting materials. Specific examples of the material include anthracene, naphthalene, pyrene, tetracene, coronene, perylene, phthaloperylene, naphthaloperylene, diphenyl butadiene, tetraphenylbutadiene, coumarin, oxadiazole, bisbenzoxazoline, bisstyryl, cyclopentadiene, quinoline metal complexes, tris(8-hydroxyquinolinato)aluminum complexes, tris(4-methyl-8-quinolinato)aluminum complexes, tris(5-phenyl-8-quinolinato)aluminum complexes, aminoquinoline metal complexes, benzoquinoline metal complexes, tri-(p-terphenyl-4-yl) amine, pyran, quinacridone, rubrene, and derivatives of the foregoing; and 1-aryl-2,5-di(2-thienyl)pyrrole derivatives, distyrylbenzene derivatives, styrylarylene derivatives, styrylamine derivatives, and compounds partly having a group constituted by the above light-emitting compound in a molecule thereof. In addition to the above-described compounds derived from fluorescent dyes, so-called phosphorescence-emitting materials may also be used. Examples of the phosphorescence-emitting materials include light-emitting materials such as iridium complexes, osmium complexes, platinum complexes, and europium complexes; and compounds and polymers having the foregoing complex in a molecule thereof. These materials can be suitably selected as needed.

The light-emitting layer 32 can be formed by a wet process such as a coating method (e.g., spin coating method, spray coating method, die coating method, gravure printing method, and screen printing method). The formation method of the light-emitting layer 32 is not limited to the coating method. The light-emitting layer 32 may be formed by a dry process such as a vacuum deposition method or a transfer method.

Examples of the material for the electron injection layer include metal halides such as metal fluorides, e.g., lithium fluoride and magnesium fluoride and metal chlorides, e.g., sodium chloride and magnesium chloride; and oxides of titanium, zinc, magnesium, calcium, barium, strontium, and the like. When these materials are used, the electron injection layer can be formed by a vacuum deposition method. The material for the electron injection layer may be, for example, an organic semiconductor material into which a dopant (e.g., alkali metal) for promoting electron injection is mixed. In this case, the electron injection layer can be formed by a coating method.

The material for the electron transport layer can be selected from the group of compounds having an electron-transporting property. Examples of the compounds include metal complexes such as $Alq_3$ known as an electron-transporting material; and heterocyclic compounds such as phenanthroline derivatives, pyridine derivatives, tetrazine derivatives, and oxadiazole derivatives. The material for the electron transport layer is not limited to these materials, and may be any publicly known electron-transporting material.

Non-limiting examples of the material for the hole transport layer include polymers containing aromatic amines, e.g., polyarylene derivatives having an aromatic amine at a side chain or a main chain thereof, such as polyvinylcarbazole (PVCz), polypyridine, and polyaniline. Examples of the material for the hole transport layer include 4,4'-bis[N-(naphthyl)-N-phenyl-amino]biphenyl ($\alpha$-NPD), N,N'-bis(3-methylphenyl)-(1,1'-bipneyl)-4,4'-diamine (TPD), 2-TNATA, 4,4',4"-tris(N-(3-methylphenyl)N-phenylamino)triphenylamine (MTDATA), 4,4'-N,N'-dicarbazole biphenyl (CBP), Spiro-NPD, spiro-TPD, spiro-TAD, TNB, and TFB (poly[(9,9-dioctylfluorenyl-2,7-diyl)-co-(4,4'-(N-(4-sec-butylphenyl))diphenyl amine)]).

The hole injection layer is made of an organic material such as thiophene, triphenylmethane, hydrazoline, amylamine, hydrazone, stilbene, or triphenylamine. Specific examples of the material include aromatic amine derivatives such as polyvinylcarbazole, polyethylenedioxythiophene:polystyrene sulfonate (PEDOT:PSS), and TPD. These materials may be used alone or in combination of two or more. The hole injection layer made of such a material can be formed by a wet process such as a coating method (e.g., spin coating method, spray coating method, die coating method, and gravure printing method).

The interlayer is formed so as to have a carrier-blocking function (here, an electron-blocking function) serving as a carrier barrier for suppressing the leakage of electrons from the light-emitting layer 32 toward the transparent electrode 13. Furthermore, the interlayer may have, for example, a function of transporting holes to the light-emitting layer 32 and a function of suppressing the quenching of the excited state of the light-emitting layer 32. In this embodiment, the interlayer serves as an electron-blocking layer for suppressing the leakage of electrons from the light-emitting layer 32.

In the organic EL element 300, an improvement in the emission efficiency and the long life can be achieved by disposing the interlayer. Examples of the material for the interlayer include polyarylamine and derivatives thereof, polyfluorene and derivatives thereof, polyvinylcarbazole and derivatives thereof, and triphenyldiamine derivatives. Such an interlayer can be formed by a wet process such as a coating method (e.g., spin coating method, spray coating method, die coating method, and gravure printing method).

The cathode is an electrode for injecting electrons into the organic layer 30. When the reflecting electrode 11 is a cathode, the cathode may be made of an electrode material such as a metal, an alloy, or an electrically conductive compound each having a low work function, or a mixture of the foregoing. An electrode material having a work function of 1.9 eV or more and 5 eV or less can be suitably used so that the difference between the work function of the reflecting electrode 11 and the lowest unoccupied molecular orbital (LUMO) level is not excessively increased. Examples of the electrode material for the cathode include aluminum, silver, magnesium, gold, copper, chromium, molybdenum, palladium, and tin; and alloys of the foregoing metal and another metal, such as a magnesium-silver mixture, a magnesium-indium mixture, and an aluminum-lithium alloy. In addition, a metal, a metal oxide, and a mixture of the foregoing and another metal can also be used. For example, the cathode may be a multi-layer film including a thin film made of aluminum and an ultrathin film (e.g., a thin film that has a thickness of 1 nm or less and allows flow of electrons by tunnel injection) made of an aluminum oxide. When the reflecting electrode 11 is a cathode, the material for the cathode may be suitably a metal, such as aluminum or silver, having low resistivity and high reflectance for light emitted from the light-emitting layer 32. When the reflecting electrode 11 is an anode for injecting holes into the organic layer 30, the material for the reflecting electrode 11 may be suitably a metal having a high work function. An electrode material having a work function of 4 eV or more and 6 eV or less may be suitably used so that the difference between the work function of the reflecting electrode 11 and the highest occupied molecular orbital (HOMO) level is not excessively increased.

Examples of the material for the conductive layer 39 of the transparent electrode 13 include conductive polymer materials such as polythiophene, polyaniline, polypyrrole, polyphenylene, polyphenylenevinylene, polyacetylene, and polycarbazole. A dopant such as sulfonic acid, Lewis acid, protonic acid, an alkali metal, or an alkaline-earth metal may be doped in order to increase the conductivity. Herein, as the resistivity of the conductive layer 39 decreases, the conductivity in a horizontal direction (in-plane direction) is improved. As a result, the in-plane variation in electric current flowing through the light-emitting layer 32 can be reduced and thus the nonuniform brightness can be suppressed.

The electrode portion 44 in the electrode pattern 42 of the transparent electrode 13 may be made of an electrode material containing a powder of a metal and an organic binder. The metal may be, for example, silver, gold, or copper. Thus, the resistivity and sheet resistance of the electrode portion can be decreased compared with the case where the transparent electrode 13 is a thin film formed of a conductive transparent oxide. Consequently, the nonuniform brightness can be suppressed. The conductive material for the electrode pattern 42 may be an alloy, carbon black, or the like instead of the metal.

The electrode pattern 42 can be formed by, for example, printing a paste (printing ink) prepared by mixing an organic binder and an organic solvent in a metal powder using a screen printing method, a gravure printing method, or the like. Examples of the organic binder include acrylic resin, polyethylene, polypropylene, polyethylene terephthalate, polymethyl methacrylate, polystyrene, polyether sulfone, polyarylate, polycarbonate resin, polyurethane, polyacrylonitrile, polyvinyl acetal, polyamide, polyimide, diacrylic phthalate resin, cellulose resin, polyvinyl chloride, polyvinylidene chloride, polyvinyl acetate, other thermoplastic resins, and copolymers of two or more of monomers that constitute the above resins. The organic binder is not limited thereto.

The second lead line 46 and the second terminal portion 47 are made of the same material as the electrode pattern 42 of the transparent electrode 13, but the material for the second lead line 46 and the second terminal portion 47 is not particularly limited. When the second lead line 46 and the second terminal portion 47 are made of the same material as the electrode pattern 42 of the transparent electrode 13, the second lead line 46, the second terminal portion 47, and the electrode pattern 42 can be formed simultaneously. The second terminal portion 47 does not necessarily have a single-layer structure, and may have a multilayer structure including two or more layers.

In the organic EL element 300 of this embodiment, the thickness of the reflecting electrode 11 is 80 to 200 nm, the thickness of the light-emitting layer 32 is 60 to 200 nm, the thickness of the hole transport layer 33 is 5 to 30 nm, the thickness of the hole injection layer 34 is 10 to 60 nm, and the thickness of the conductive layer 39 is 200 to 400 nm. These thicknesses are merely examples and are not particularly limited.

Figure 36:
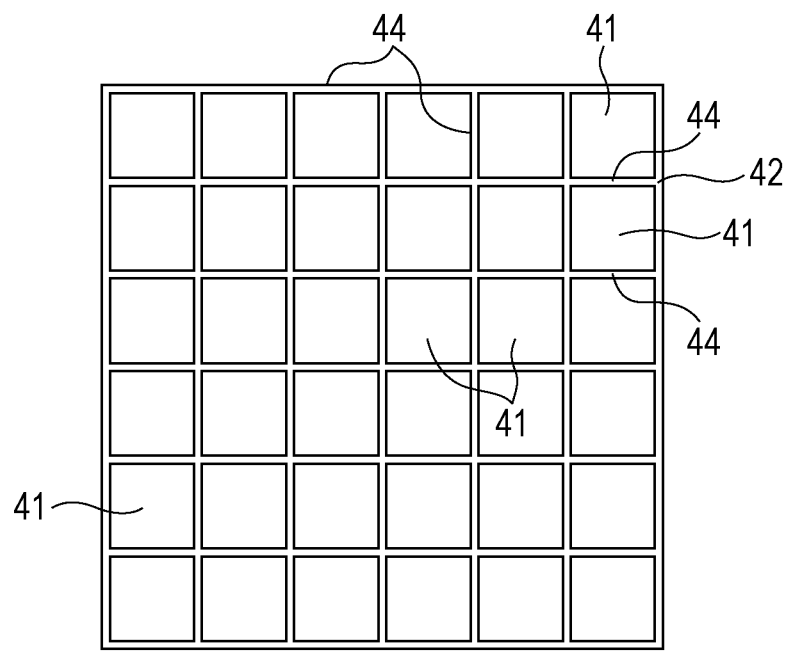
FIG. 36 is a plan view illustrating a structure of an electrode pattern in the third embodiment.

As illustrated in FIG. 36, the electrode pattern 42 is formed in a grid-like (net-like) manner and has a plurality of openings 41 (e.g., 6×6=36). The electrode pattern 42 illustrated in FIG. 36 has a square lattice shape in which the shape of each of the openings 41 in plan view is a square, but the shape of the electrode pattern 42 is not limited thereto.

Figure 37:
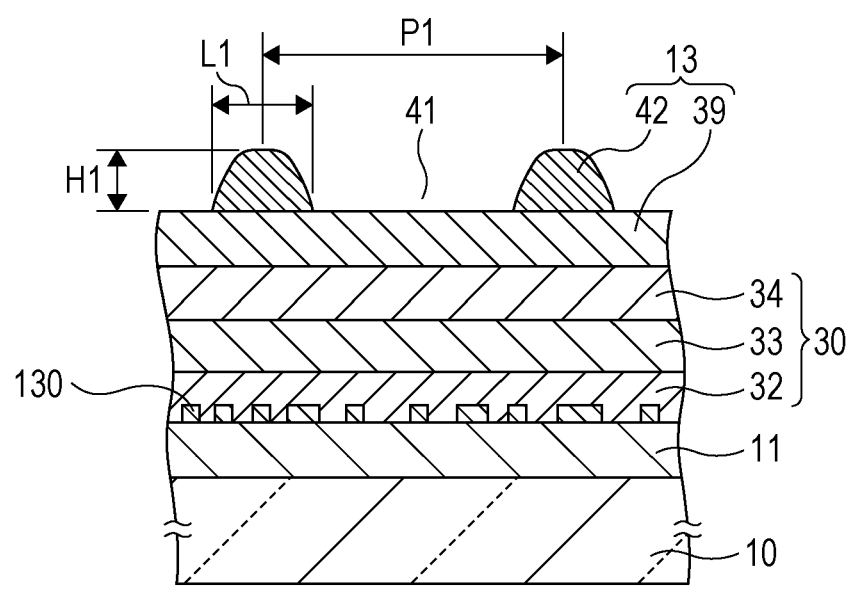
FIG. 37 is a diagram for describing the dimensions of the electrode pattern having a square lattice shape in the third embodiment.

An example of the dimensions of the electrode pattern 42 having a square lattice shape in the transparent electrode 13 is described below. Referring to FIG. 37, the line width L1 of the electrode portion 44 in the electrode pattern 42 may be 1 μm to 100 μm, the height H1 may be 50 nm to 100 μm, and the pitch P1 may be 100 μm to 2000 μm. The line width L1, the height H1, and the pitch P1 of the electrode portion 44 in the electrode pattern 42 are not limited to the above ranges, and may be suitably set in accordance with the planar sizes of the reflecting electrode 11 and the element unit 1. Herein, the line width L1 of the electrode portion 44 in the electrode pattern 42 is desirably decreased in view of utilization efficiency of light emitted from the light-emitting layer 32. However, the line width L1 is desirably increased in order to suppress the nonuniform brightness by decreasing the resistance of the transparent electrode 13. Therefore, the line width L1 of the electrode portion 44 may be suitably set in accordance with the planar size of the organic EL element 300 and the performance required for the organic EL element 300. The height H1 of the electrode portion 44 is set in view of a decrease in the resistance of the transparent electrode 13, the material usage efficiency in the formation of the electrode pattern 42 by a coating method such as a screen printing method, and the radiation angle of light radiated from the organic layer 30. The height H1 is set, for example, in the range of 100 nm or more and 10 μm or less, but is not limited thereto.

The sealing substrate 80 serving as a cover substrate is, for example, a glass substrate, but is not limited thereto. The sealing substrate 80 may be formed of another material such as a plastic plate. The glass substrate may be made of, for example, soda-lime glass or alkali-free glass. The plastic plate may be made of polyethylene terephthalate, polyethylene naphthalate, polyether sulfone, or polycarbonate. When the substrate 10 is a glass substrate, the sealing substrate 80 is desirably a glass substrate made of the same material as the substrate 10.

The sealing substrate 80 desirably has a total light transmittance for visible light of, for example, 70% or more, but the total light transmittance is not limited thereto. The total light transmittance of the sealing substrate 80 is desirably as high as possible in view of the improvement in the light extraction efficiency of the organic EL element 300. The total light transmittance can be measured by, for example, a method specified in ISO 13468-1.

In this embodiment, the sealing substrate 80 has a plate-like shape, but may have another shape. For example, a substrate in which a recess for accommodating the element unit 1 is formed may be provided so as to face the substrate 10, and the entire periphery of the recess may be bonded to the substrate 10. This structure provides an advantage in that there is no need to use the frame unit 95, which is an additional member. When the sealing substrate 80 having a plate-like shape and the frame unit 95 are provided as different members, both a material that satisfies the optical properties (e.g., light transmittance and refractive index) required for the sealing substrate 80 and a material that satisfies the properties (e.g., gas barrier property) required for the frame unit 95 can be employed.

In this embodiment, a bonding material (referred to as a "first bonding material") for bonding the frame unit 95 to the electrode-side surface of the substrate 10 is an epoxy resin, but is not limited thereto. The bonding material may be, for example, an acrylic resin. The epoxy resin or the acrylic resin used as the first bonding material may be, for example, an ultraviolet curable resin or a thermosetting resin. The first bonding material may be prepared by adding a filler (e.g., silica and alumina) to an epoxy resin. The frame unit 95 is bonded to the electrode-side surface of the substrate 10 so that airtightness is achieved over the entire surface of the frame unit 95 that faces the substrate 10.

In this embodiment, a bonding material (referred to as a "second bonding material") for bonding the frame unit 95 to the sealing substrate 80 is an epoxy resin, but is not limited thereto. The bonding material may be, for example, an acrylic resin or fritted glass. The epoxy resin or the acrylic resin used as the second bonding material may be, for example, an ultraviolet curable resin or a thermosetting resin. The second bonding material may be prepared by adding a filler (e.g., silica and alumina) to an epoxy resin. The frame unit 95 is bonded to the sealing substrate 80 so that airtightness is achieved over the entire surface of the frame unit 95 that faces the sealing substrate 80.

The insulating layer 60 may be made of a material obtained by adding a moisture absorbent to a photo-curable resin such as an epoxy resin, an acrylic resin, or a silicone resin. The moisture absorbent may be, for example, an alkaline-earth metal oxide or a sulfate. Examples of the alkaline-earth metal oxide include calcium oxide, barium oxide, magnesium oxide, and strontium oxide. Examples of the sulfate include lithium sulfate, sodium sulfate, gallium sulfate, titanium sulfate, and nickel sulfate. In addition, the moisture absorbent may be an inorganic compound such as calcium chloride, magnesium chloride, copper chloride, or magnesium oxide. Alternatively, the moisture absorbent may be a compound having moisture absorbency, such as silica gel or polyvinyl alcohol. The material for the moisture absorbent is not particularly limited. Among these compounds, calcium oxide, barium oxide, and silica gel are particularly suitably used. The content of the moisture absorbent in the insulating layer 60 is not particularly limited.

The uneven structure 130 at the interface between the organic layer 30 and the reflecting electrode 11 is formed in a pattern in which the randomness is controlled so that a predetermined number of the same structures or more are not continuously formed in the arrangement direction. For example, the uneven structure 130 can be formed in the pattern illustrated in FIG. 23A, 24A, or 27B. The uneven structure 130 may be formed in a pattern different from the above patterns. As illustrated in FIGS. 32A and 32B, an uneven structure similar to the uneven structure 130 may be formed at an interface between the organic layer 112 and the transparent electrode 113.

The organic EL elements described in the above embodiments can be suitably used as, for example, organic EL elements for illumination, but can also be used in other applications.

The drawings used to describe the above embodiments are schematically illustrated. The ratios of the sizes and thicknesses of the components are not necessarily the actual dimensional ratios.

Example 1

In Example 1, the organic EL element 300 illustrated in FIG. 35 was produced. The production conditions of the organic EL element 300 in Example 1 are as follows. First, a substrate 10 was prepared in the production of the organic EL element 300 in Example 1.

A first step was performed. In the first step, a reflecting electrode (cathode) 11 having a thickness of 120 nm and composed of an aluminum film was formed on one surface of the substrate 10 by a vacuum deposition method. Herein, an uneven structure 130 having a square-based sectional shape illustrated in FIG. 24A was formed on a surface of the reflecting electrode 11. The size w of squares of depressions and projections was set to be 0.8 nm and the height was set to be 60 nm.

After the first step, a second step of forming an organic layer 30 was performed. In the second step, a light-emitting layer 32, a hole transport layer 33, and a hole injection layer 34 were sequentially formed.

In the formation of the light-emitting layer 32, a solution prepared by dissolving a red polymer material ("Light Emitting Polymer ATS111RE" manufactured by American Dye Source, Inc.) in a THF solvent so as to have a concentration of 1 wt % was applied onto the reflecting electrode 11 with a spin coater so as to have a thickness of about 200 nm. Subsequently, firing was performed at 100° C. for 10 minutes to form a light-emitting layer 32. The refractive index of the light-emitting layer 32 was about 1.8.

In the formation of the hole transport layer 33, a solution prepared by dissolving TFB ("Hole Transport Polymer ADS259BE" manufactured by American Dye Source, Inc.) in a THF solvent so as to have a concentration of 1 wt % was applied onto the light-emitting layer 32 with a spin coater so as to have a thickness of about 12 nm. Subsequently, the resulting TFB coating film was fired at 200° C. for 10 minutes to form a hole transport layer 33. The refractive index of the hole transport layer 33 was about 1.8.

In the formation of the hole injection layer 34, a solution prepared by mixing PEDOT-PSS ("CLEVIOUS P VP AI4083" manufactured by Heraeus, PEDOT:PSS=1:6) and isopropyl alcohol at a ratio of 1:1 was applied onto the hole transport layer 33 with a spin coater so that the PEDOT-PSS had a thickness of about 100 nm. Subsequently, firing was performed at 150° C. for 10 minutes to form a hole injection layer 34. The refractive index of the hole injection layer 34 was about 1.5.

After the second step, a third step of forming a conductive layer 39 was performed. In the third step, a high electrical conduction type PEDOT-PSS ("CLEVIOUS SHT" manufactured by Heraeus) was applied by a screen printing method. Subsequently, a heat treatment was performed in a nitrogen atmosphere at 130° C. for 30 minutes to form a conductive layer 39. The refractive index of the conductive layer 39 was about 1.43.

After the third step, a fourth step of forming an insulating layer 60 was performed. In the fourth step, an imide resin ("HRI 1783" manufactured by OPTMATE, refractive index: 1.78, concentration: 18%) was applied using a screen plate as a mask and then heat-treated in a nitrogen atmosphere at 130° C. for 30 minutes to form an insulating layer 60.

After the fourth step, a fifth step of forming an electrode pattern 42 was performed. In the fifth step, a Ag paste was applied using a screen plate having a line width of 50 μm and a space width of 500 μm as a mask and then heat-treated in a nitrogen atmosphere at 130° C. for 30 minutes to form an electrode pattern 42. Herein, the electrode pattern 42 was formed while the insulating layer 60 and the electrode pattern 42 were aligned so as to overlap each other in the thickness direction. The screen plate used in the fifth step includes openings for forming a first lead line, a first terminal portion, a second lead line 46, and a second terminal portion 47. Therefore, in the fifth step, not only the electrode pattern 42, but also the first lead line, the first terminal portion, the second lead line 46, and the second terminal portion 47 are formed. In the organic EL element 300 of Example 1, a transparent electrode 13 including the conductive layer 39 and the electrode pattern 42 serves as an anode.

In the production of the organic EL element 300 in Example 1, a sixth step was performed after the completion of the first step to the fifth step. In the sixth step, the substrate 10 was transferred into a glove box with a dry nitrogen atmosphere at a dew point of −80° C. or less without being exposed to the air. A sealing cap made of alkali-free glass and including a sealing substrate 80 and a frame unit 95 in a combined manner was prepared. A sealant made of an ultraviolet curable epoxy resin was applied onto the frame unit 95 of the sealing cap. In the glove box, the sealing cap was bonded to the substrate 10 with the sealant so that the sealing cap and the substrate 10 surrounded an element unit 1. Thus, an organic EL element 300 was produced.

Comparative Example 1

In Comparative Example 1, an organic EL element in which the uneven structure 130 was removed from the organic EL element 300 of Example 1 was produced. The production conditions of Comparative Example 1 were the same as those of Example 1, except that the uneven structure 130 was not formed.

Examination Results by Experiment

The organic EL elements of Example 1 and Comparative Example 1 were produced, and the light extraction efficiency was measured. Table 2 shows the results.

TABLE 2

|  | Uneven structure | Light extraction efficiency ratio |
| --- | --- | --- |
| Example 1 | Yes | 1.61 |
| Comparative Example 1 | No | 1.00 |

Table 2 shows the "light extraction efficiency ratio", which is a relative value of the light extraction efficiency of the organic EL element in Example 1 when the light extraction efficiency of the organic EL element in Comparative Example 1 is assumed to be 1.0. The light extraction efficiency was measured as follows. A constant current having a current density of 10 mA/cm$^2$ was caused to flow using a DC power source ("2400" manufactured by Keithley Instruments Inc.) between the second terminal portion 47 and the first terminal portion of each of the organic EL elements of Example 1 and Comparative Example 1. The total radiant flux was measured with an integrating sphere, and the light extraction efficiency was determined on the basis of the measurement results. Furthermore, a constant current having a current density of 10 mA/cm$^2$ was caused to flow using a DC power source ("2400"

manufactured by Keithley Instruments Inc.) between the second terminal portion 47 and the first terminal portion of each of the organic EL elements of Example 1 and Comparative Example 1. The brightness of light emitted at an angle of 0 to 80° was measured with a luminance meter ("SR-3" manufactured by TOPCON TECHNOHOUSE CORPORATION) to calculate the light extraction efficiency.

As is clear from Table 2, the light extraction efficiency of the organic EL element of Example 1 is 1.61 times higher than that of the organic EL element of Comparative Example 1.

Figure 38:
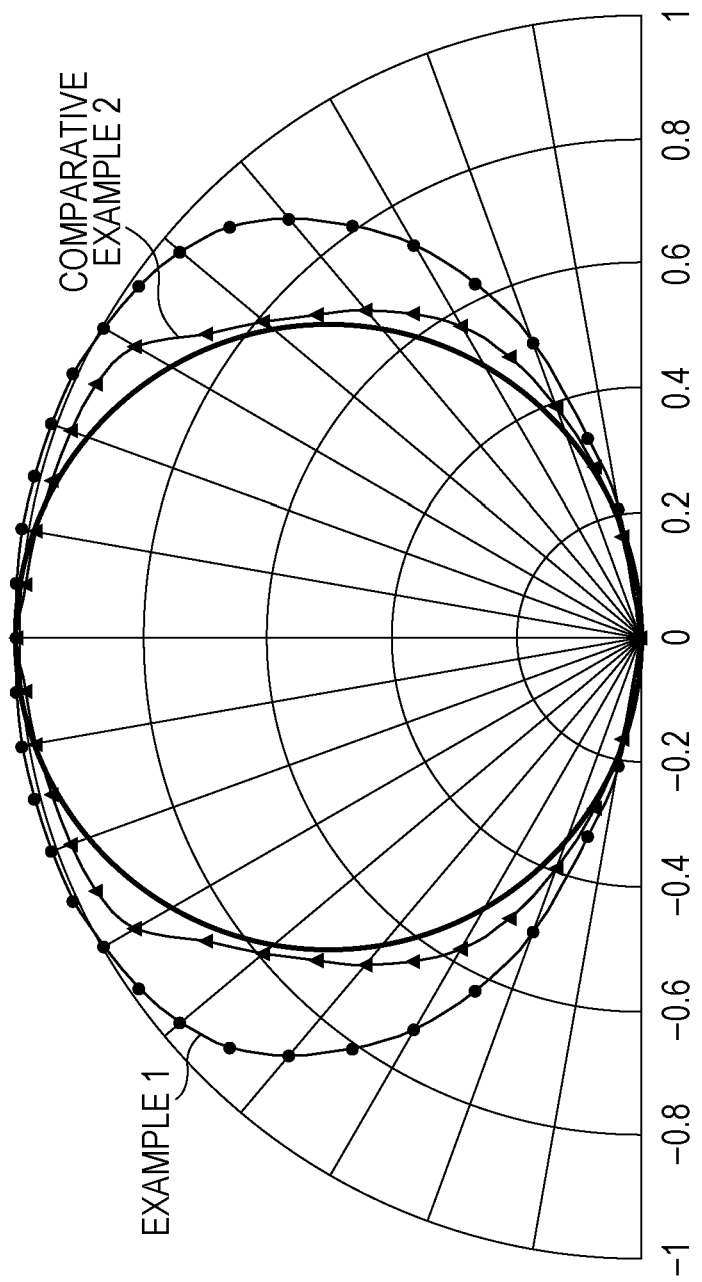
FIG. 38 illustrates the viewing angle dependence in Example 1 and Comparative Example 2 of the third embodiment.

An organic EL element of Comparative Example 2 in which the uneven structure 130 of the organic EL element 300 in Example 1 was changed to a diffraction grating having a periodical pattern was produced. The pitch of the depressions and projections was 1 µm and the height of the depressions and projections was 60 nm. FIG. 38 illustrates the viewing angle dependence in Example 1 and Comparative Example 2. In Example 1 in which the random structure illustrated in FIG. 24A was used, gently curved viewing angle characteristics were achieved. In Comparative Example 2 in which the diffraction grating was used, the intensity rapidly changed depending on the angle. Thus, it can be confirmed that the viewing angle dependence was improved in Example 1. In addition, the extraction efficiency was higher in the random structure than in the diffraction grating.

Figure 39:
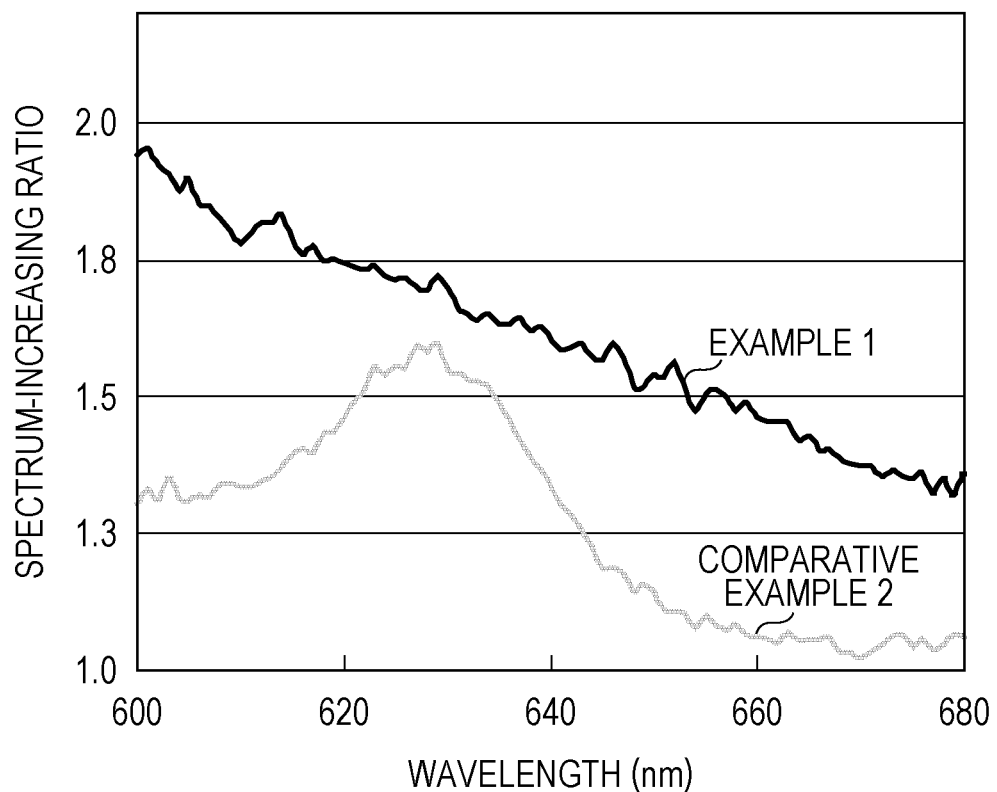
FIG. 39 shows the measurement results of spectrum-increasing ratios between Example 1 and Comparative Example 1 and between Comparative Example 2 and Comparative Example 1 in the third embodiment.

FIG. 39 shows the measurement results of spectrum-increasing ratios between Example 1 and Comparative Example 1 and between Comparative Example 2 and Comparative Example 1. Herein, the spectrum-increasing ratios of Example 1 and Comparative Example 2 were calculated with respect to the intensity of each wavelength component in Comparative Example 1 in which no uneven structure was formed. As shown in FIG. 39, the spectrum intensity was increased only at a wavelength of about 630 nm in Comparative Example 2 in which the diffraction grating was used whereas the spectrum intensity was increased in a wide range in Example 1 in which the random structure was formed. This is because the random structure illustrated in, for example, FIG. 24A has frequency components in a relatively wide range.

Figure 40:
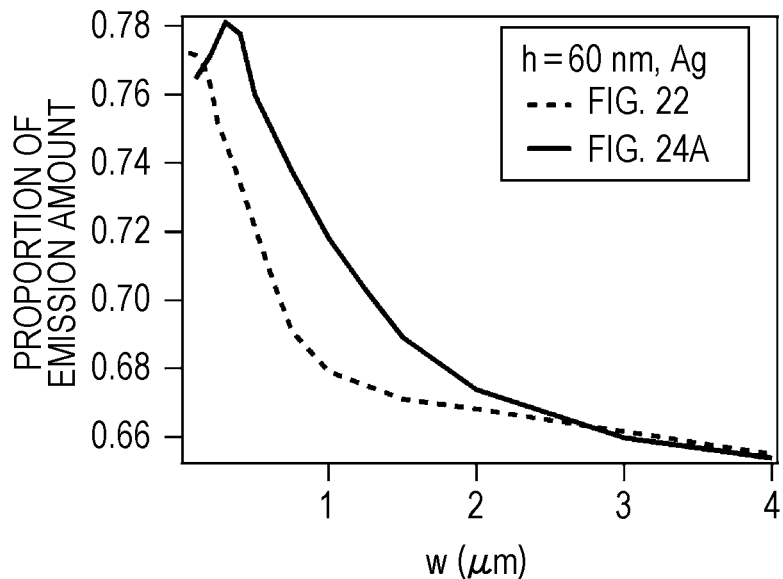
FIG. 40 shows the calculation result of the proportion of an emission amount relative to the size w of a structure in each of the patterns illustrated in FIGS. 22 and 24A.

Next, the comparison result between the completely random pattern illustrated in FIG. 22 and the controlled random pattern (low frequency-removed structure) illustrated in FIG. 24A will be described. FIG. 40 shows the calculation result of the proportion of an emission amount relative to the size w of a structure in each of the patterns. As shown in FIG. 40, when w is in the range of 300 nm to about 3.0 µm, the pattern illustrated in FIG. 24A provides a higher improvement effect than the pattern illustrated in FIG. 22. In the structure illustrated in FIG. 24A, the range of w suitable for suppressing a surface plasmon is 100 nm or more and 1500 nm or less as described above. Therefore, in the range of 300 nm or more and 1500 nm or less, an effect of suppressing the surface plasmon due to the low frequency-removed structure and an effect of increasing the emission amount can be simultaneously produced. Herein, w is not limited to the above range, and a relatively large emission amount can be achieved as long as w is in the range of 100 nm or more and 3000 nm or less.

Figure 41:
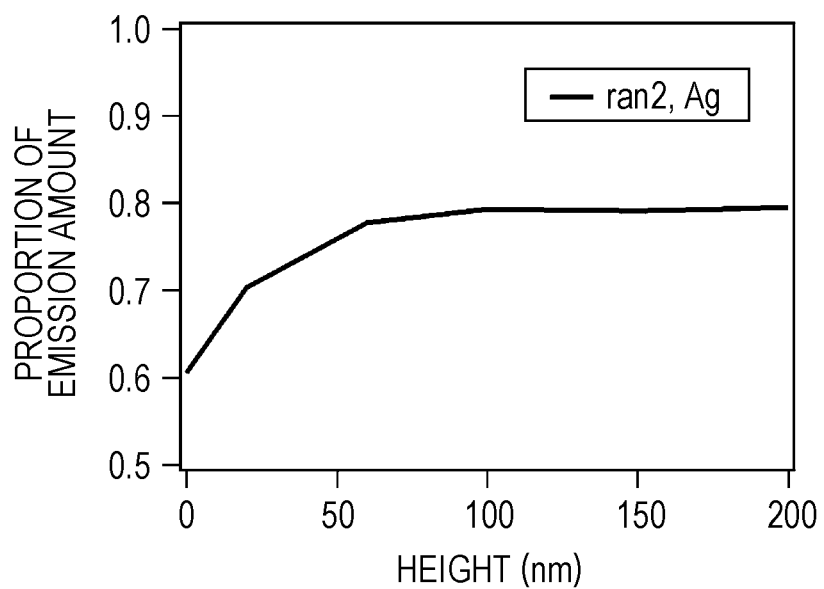
FIG. 41 is a graph showing the dependence of the proportion of an emission amount relative to the height of depressions and projections in the low frequency-removed structure illustrated in FIG. 24A.

FIG. 41 is a graph showing the dependence of the proportion of an emission amount relative to the height of depressions and projections in the low frequency-removed structure illustrated in FIG. 24A. Herein, the calculation was conducted on the assumption that w=500 nm. As in the case of the periodical structure illustrated in FIG. 6, the proportion of the emission amount is substantially constant when the height of depressions and projections is about 100 nm or more. Consequently, the generation of the surface plasmon can be substantially suppressed. The height of the uneven structure is typically set to be 100 nm or less to prevent the leakage path of an electric current from being formed when the difference in level between depressions and projections is larger than the thickness of each layer of the organic layer adjacent to the uneven structure.

According to the above embodiments, there can be provided a light-emitting device in which color irregularity and nonuniform brightness are suppressed while the emission efficiency is improved by suppressing the influence of a surface plasmon.

The light-emitting device of the present disclosure can be widely used as a light-emitting device for flat panel displays, backlight units for liquid crystal displays, light sources for illumination, and the like.

What is claimed is:

1. A light-emitting device comprising:
   a light-emitting element including a transparent electrode, a reflecting electrode, and an organic layer that includes a light-emitting layer and is sandwiched between the transparent electrode and the reflecting electrode;
   a transparent multilayer body including a low-refractive-index layer and a high-refractive-index layer, the high-refractive-index layer having higher refractive index than that of the low-refractive-index layer and being provided in contact with the transparent electrode;
   a first uneven structure at an interface between the low-refractive-index layer and the high-refractive-index layer, the first uneven structure including depressions and projections, a height of each of the projections relative to the depressions being 400 nm or more; and
   a second uneven structure at an interface between the reflecting electrode and the organic layer, the second uneven structure including depressions and projections, a height of each of the projections relative to the depressions in the second uneven structure being 20 nm or more and 100 nm or less.

2. The light-emitting device according to claim 1, wherein the first uneven structure has a shape in which the depressions and the projections are two-dimensionally arranged in a periodical manner, and the first uneven structure has an average pitch of 800 nm or more and 6 µm or less.

3. The light-emitting device according to claim 1, wherein the first uneven structure has an uneven shape in which at least two types of unit structures are two-dimensionally arranged in a random manner, each type of the unit structures having a pattern formed by one or more depressions and one or more projections.

4. The light-emitting device according to claim 3, wherein, assuming that a minimum length of minor axes of ellipses inscribed in plane sections of the depressions and plane sections of the projections in the first uneven structure is w, the amount of pitch components with larger than 2 w among pitch components of a pattern of the uneven shape is smaller than that in a case where the depressions and the projections are randomly arranged.

5. The light-emitting device according to claim 3, wherein w in the first uneven structure is 400 nm or more and 3 µm or less.

6. The light-emitting device according to claim 1, wherein the second uneven structure has a shape in which the depressions and the projections are two-dimensionally arranged in a periodical manner.

7. The light-emitting device according to claim 1, wherein the second uneven structure has an uneven shape in which at least two types of unit structures are two-dimensionally arranged in a random manner, each type of the unit structures having a pattern formed by one or more depressions and one or more projections.

8. The light-emitting device according to claim 7, wherein, assuming that a minimum length of minor axes of ellipses inscribed in plane sections of the depressions and plane sections of the projections in the second uneven structure is w, the amount of pitch components with larger than 2 w among pitch components of a pattern of the second uneven structure is smaller than that in a case where the depressions and the projections are randomly arranged.

9. The light-emitting device according to claim 7, wherein w in the second uneven structure is 100 nm or more and 3000 nm or less.

10. The light-emitting device according to claim 7, wherein in the second uneven structure, more than a predetermined number of depressions or projections are not continuously arranged in an arrangement direction.

11. The light-emitting device according to claim 1, wherein a pattern of the first uneven structure is identical to a pattern of the second uneven structure.

12. The light-emitting device according to claim 1, wherein an average pitch in the second uneven structure is smaller than $$\gamma_{sur} = \frac{c}{2\omega}\left[\mathrm{Im}\sqrt{\frac{\varepsilon_{org}\varepsilon_{metal}}{\varepsilon_{org}+\varepsilon_{metal}}}\right]^{-1}$$

where $\in_{org}$ represents a complex dielectric constant of the organic layer, $\in_{metal}$ represents a complex dielectric constant of the reflecting electrode, $\omega$ represents an average emission frequency, and c represents a speed of light in a vacuum.

* * * * *